(12) United States Patent
Ashford et al.

(10) Patent No.: US 8,780,361 B2
(45) Date of Patent: Jul. 15, 2014

(54) APPARATUS AND METHOD FOR CALIBRATING LASER PROJECTION SYSTEM

(75) Inventors: Curtis M. Ashford, St. Peters, MO (US); Brian A. Bollinger, St. Charles, MO (US)

(73) Assignee: The Boeing Company, Chicago, IL (US)

( * ) Notice: Subject to any disclaimer, the term of this patent is extended or adjusted under 35 U.S.C. 154(b) by 220 days.

(21) Appl. No.: 13/366,260

(22) Filed: Feb. 3, 2012

(65) Prior Publication Data

US 2013/0201491 A1 Aug. 8, 2013

(51) Int. Cl.
*G01B 11/14* (2006.01)
*G01B 11/00* (2006.01)
*G03F 9/00* (2006.01)

(52) U.S. Cl.
CPC .............. *G01B 11/14* (2013.01); *G01B 11/002* (2013.01); *G01B 11/00* (2013.01); *G03F 9/7088* (2013.01)
USPC ............ 356/620; 356/121; 356/122; 356/614

(58) Field of Classification Search
CPC .... G01B 11/002; G01B 11/00; G01B 11/005; G03F 9/7088; G03F 9/7011
USPC .......................................... 356/614, 620, 121
See application file for complete search history.

(56) References Cited

U.S. PATENT DOCUMENTS

| | | | |
|---|---|---|---|
| 5,681,981 A | 10/1997 | McMurtry | |
| 7,463,368 B2 * | 12/2008 | Morden et al. | 356/614 |
| 7,545,517 B2 * | 6/2009 | Rueb et al. | 356/614 |
| 7,826,069 B2 * | 11/2010 | Rueb et al. | 356/614 |
| 7,965,396 B2 | 6/2011 | Ashford et al. | |
| 2007/0024810 A1 | 2/2007 | Ashford | |
| 2009/0229339 A1 * | 9/2009 | Ashford et al. | 73/1.79 |

OTHER PUBLICATIONS

460A Series Low-Profile Integrated Ball Bearing Linear Stages Brochure, Newport Corporation, Irvine, California, 2 pages.
European Patent Office Extended European Search Report for Counterpart Patent Application No. 13151726.0-1558 / 2623930, Applicant The Boeing Company, dated Feb. 11, 2014, 6 pages.

* cited by examiner

*Primary Examiner* — Tarifur Chowdhury
*Assistant Examiner* — Isiaka Akanbi

(57) ABSTRACT

In an embodiment of the disclosure, there is provided an apparatus for calibrating a laser projection system. The apparatus has a structural frame assembly extending along three mutually orthogonal axes. The apparatus further has a plurality of non-movable reflective targets disposed on the structural frame assembly. The apparatus further has at least three positioning stages coupled to the structural frame assembly respectively about each of the three mutually orthogonal axes. At least one movable reflective target is disposed on each positioning stage. The non-movable reflective targets and the at least one movable reflective target are each configured to reflect a laser beam from a laser projection system.

20 Claims, 18 Drawing Sheets

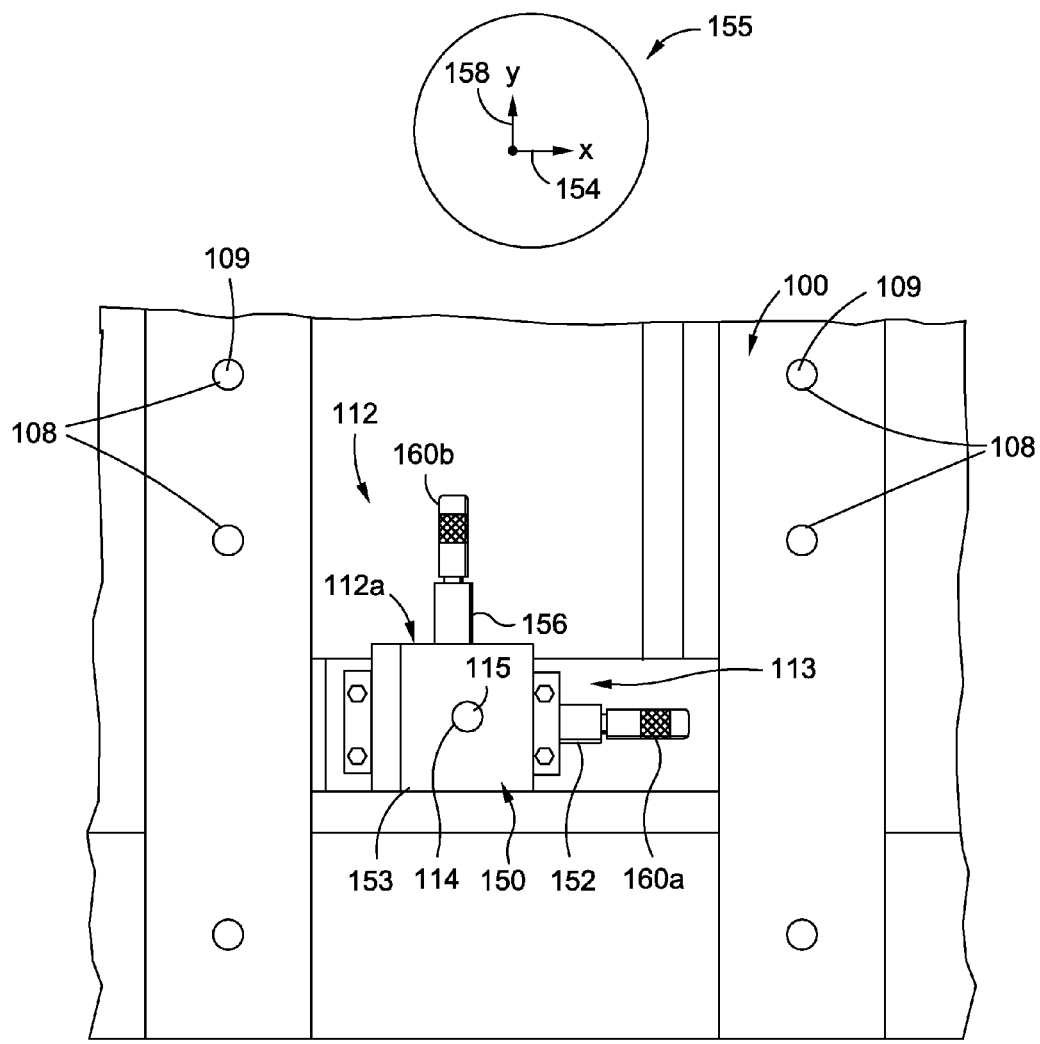

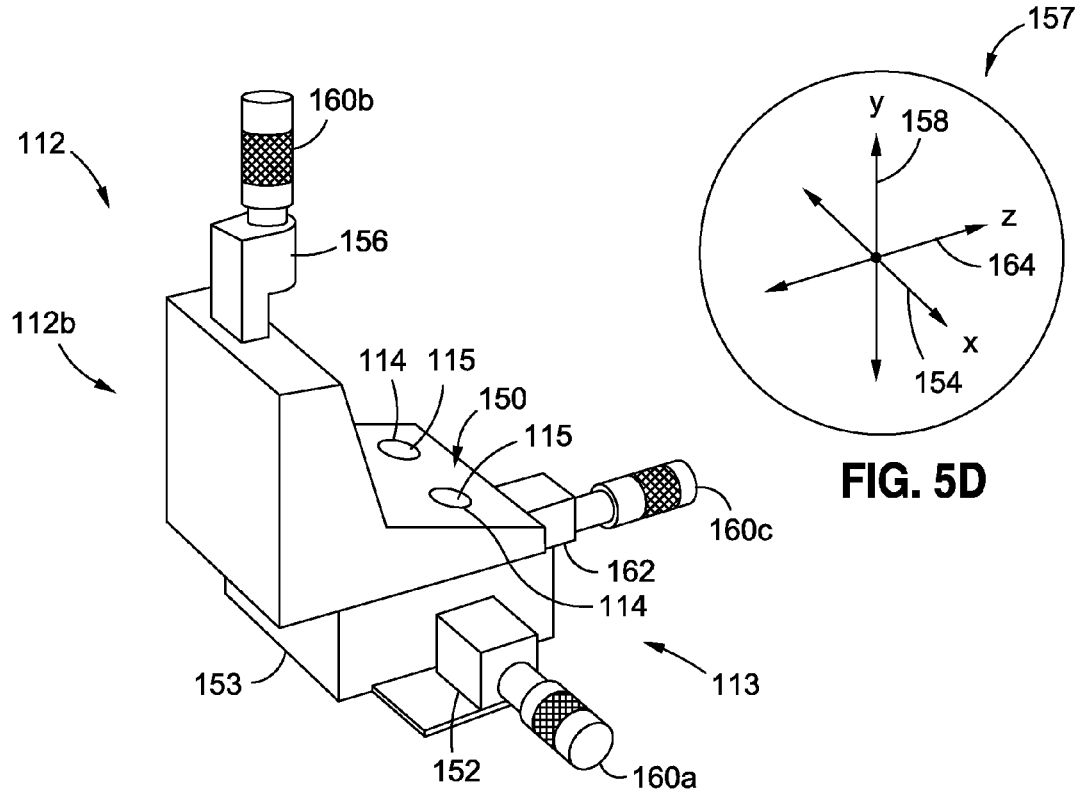

APPARATUS AND METHOD FOR CALIBRATING LASER PROJECTION SYSTEM

BACKGROUND

1) Field of the Disclosure

The disclosure relates generally to calibrating laser projection systems, and more specifically, to devices, systems and methods having three-dimensional measurement capability for calibrating laser projection systems.

2) Description of Related Art

Laser projection systems are used to record visible images directly onto components during an assembly process. In some applications, laser projection systems may be used to provide guidance during manufacturing and assembly of components, such as carbon fiber reinforced plastic (CFRP) components. In other applications, laser projection systems may be used to create markings and images on production parts. The laser marking of such parts may facilitate the subsequent processing and assembly of the parts into a cohesive superstructure. Typically, a laser projection system includes a plurality of laser projectors capable of generating laser beams. Accordingly, the use of laser projection systems for guidance and marking applications generally demands that the orientations of the projected laser beams be properly calibrated with respect to one another. Current calibration mechanisms typically rely on visual estimation of the offsets between the orientations of the various lasers of a laser projection system to create a best fit value for calibration. The use of visual estimation by a human operator to calibrate a laser projection system that is critical to manufacturing may be a time consuming trial and error process that reduces overall component production and assembly efficiency.

Known two-dimensional calibration walls for laser projection systems, such as disclosed in U.S. Pat. No. 7,965,396 B2 ("Enhanced Laser Projector Calibration Wall"), have been used to perform two-dimensional calibration of laser projectors of known laser projection systems and have improved efficiency over visual estimation calibration methods in determining the proper two-dimensional calibration of such known laser projection systems. However, such known two-dimensional calibration walls, alone, are not capable of three-dimensional measurement and cannot enable measurement of defined features in three-dimensional space. Thus, for known laser projection systems with laser projectors that use three-dimensional laser projections in manufacturing applications and that require standards to enable additional types of feature based measurements, there is a need for an apparatus, system and method having three-dimensional measurement capability and enabling three-dimensional laser projection system calibrations.

SUMMARY

This need for an apparatus, system and method having three-dimensional measurement capability and enabling three-dimensional laser projection system calibrations is satisfied. As discussed in the below detailed description, embodiments of the improved apparatus, system and method may provide significant advantages over known devices, systems and methods.

In an embodiment of the disclosure, there is provided an apparatus for calibrating a laser projection system. The apparatus comprises a structural frame assembly extending along three mutually orthogonal axes. The apparatus further comprises a plurality of non-movable reflective targets disposed on the structural frame assembly. The apparatus further comprises at least three positioning stages coupled to the structural frame assembly respectively about each of the three mutually orthogonal axes. At least one movable reflective target is disposed on each positioning stage. The non-movable reflective targets and the at least one movable reflective target are each configured to reflect a laser beam from a laser projection system.

In another embodiment of the disclosure, there is provided a three-dimensional enhanced laser projection calibration volume system. The system comprises a structural frame assembly extending along three mutually orthogonal axes. The structural frame assembly comprises a two-dimensional calibration wall, and a three-dimensional structural assembly extending from the two-dimensional calibration wall portion. The structural frame assembly further comprises a plurality of non-movable reflective targets disposed on the structural frame assembly. The structural frame assembly further comprises at least three positioning stages coupled to the structural frame assembly respectively about each of the three mutually orthogonal axes. At least one movable reflective target is disposed on each positioning stage. The system further comprises a laser projection system. The laser projection system comprises a laser projector apparatus to be calibrated, and a plurality of laser beams projected from the laser projector apparatus and projected at selected non-movable reflective targets and the at least one movable reflective target. The non-movable reflective targets and the at least one movable reflective target are each configured to reflect a laser beam from the laser projector apparatus of the laser projection system.

In another embodiment of the disclosure, there is provided a method for calibrating a laser projection system. The method comprises projecting a plurality of laser beams from a laser projection system to a corresponding number of at least three reflective targets positioned about three mutually orthogonal axes of a reference system. A proximity of each reflective target to the other reflective targets defines a laser projection calibration system having a predetermined tolerance. The method further comprises centering each of one or more first laser beams from the plurality of laser beams onto a corresponding non-movable reflective target included in the at least three reflective targets. The method further comprises moving one or more movable reflective targets included in the at least three reflective targets so that each of one or more second laser beams from the plurality of laser beams is centered on a movable reflective target. The method further comprises obtaining one or more measurements that indicate a deviation of each of the one or more movable reflective targets from a corresponding original position. The method further comprises comparing at least one deviation to a corresponding predetermined tolerance in order to calibrate the laser projection system.

The features, functions, and advantages that have been discussed can be achieved independently in various embodiments of the disclosure or may be combined in yet other embodiments further details of which can be seen with reference to the following description and drawings.

BRIEF DESCRIPTION OF THE DRAWINGS

The disclosure can be better understood with reference to the following detailed description taken in conjunction with the accompanying drawings which illustrate preferred and exemplary embodiments, but which are not necessarily drawn to scale, wherein:

FIG. 5A is an illustration of a two-axis positioning stage that may be used in embodiments of an apparatus, a system and a method of the disclosure;

FIG. 5B is an illustration of an x-y axis;

FIG. 5C is an illustration of a three-axis positioning stage that may be used in embodiments of an apparatus, a system and a method of the disclosure;

FIG. 5D is an illustration of an x-y-z axis;

DETAILED DESCRIPTION

Disclosed embodiments will now be described more fully hereinafter with reference to the accompanying drawings, in which some, but not all of the disclosed embodiments are shown. Indeed, several different embodiments may be provided and should not be construed as limited to the embodiments set forth herein. Rather, these embodiments are provided so that this disclosure will be thorough and complete and will fully convey the scope of the disclosure to those skilled in the art.

Figure 1:
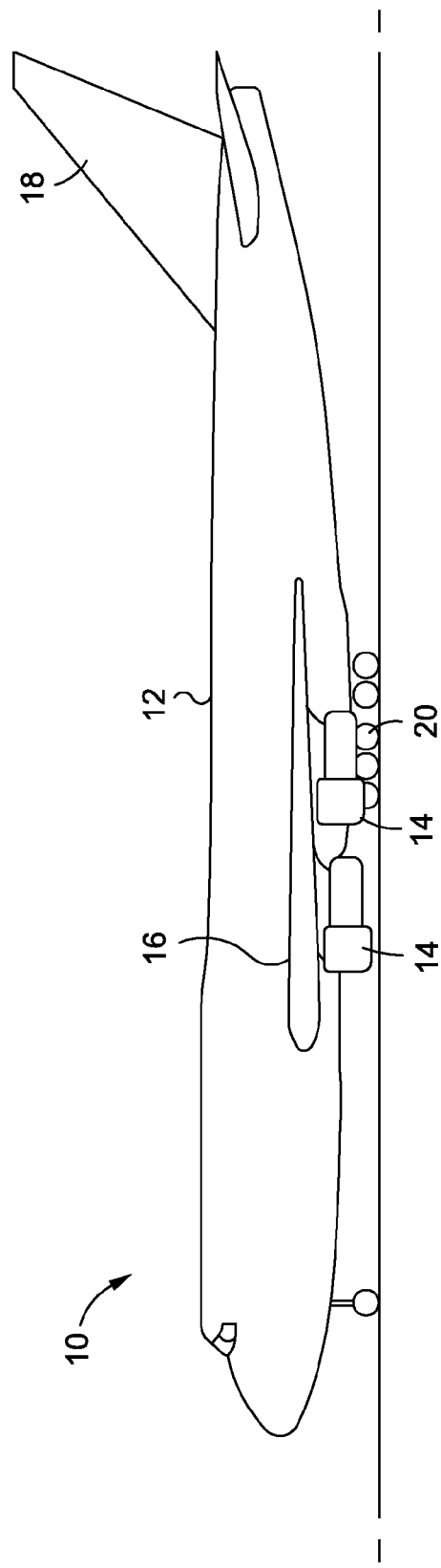
FIG. 1 is an illustration of a side elevational view of an aircraft that includes components that may be assembled or manufactured using laser projection systems calibrated by one or more advantageous embodiments of an apparatus, a system and a method of the disclosure.
Figure 7A:
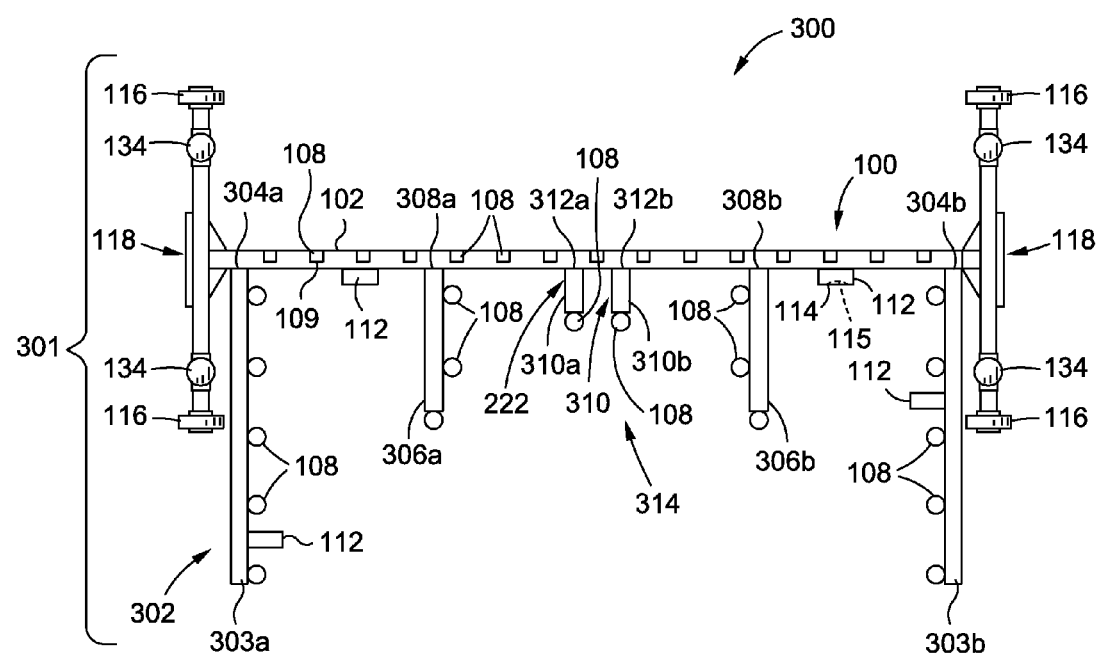
FIG. 7A is an illustration of a bottom view of another embodiment of an exemplary apparatus of the disclosure.
Figure 7B:
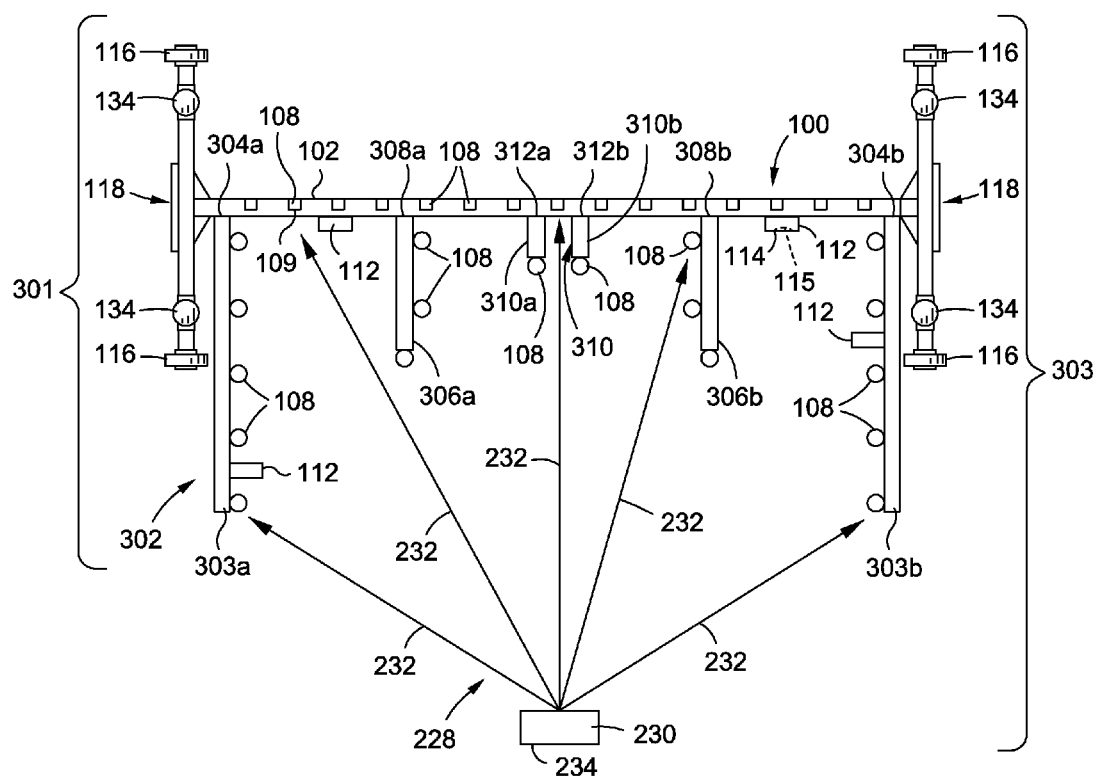
FIG. 7B is an illustration of a bottom view of the apparatus of FIG. 7A and a laser projection system.
Figure 8:
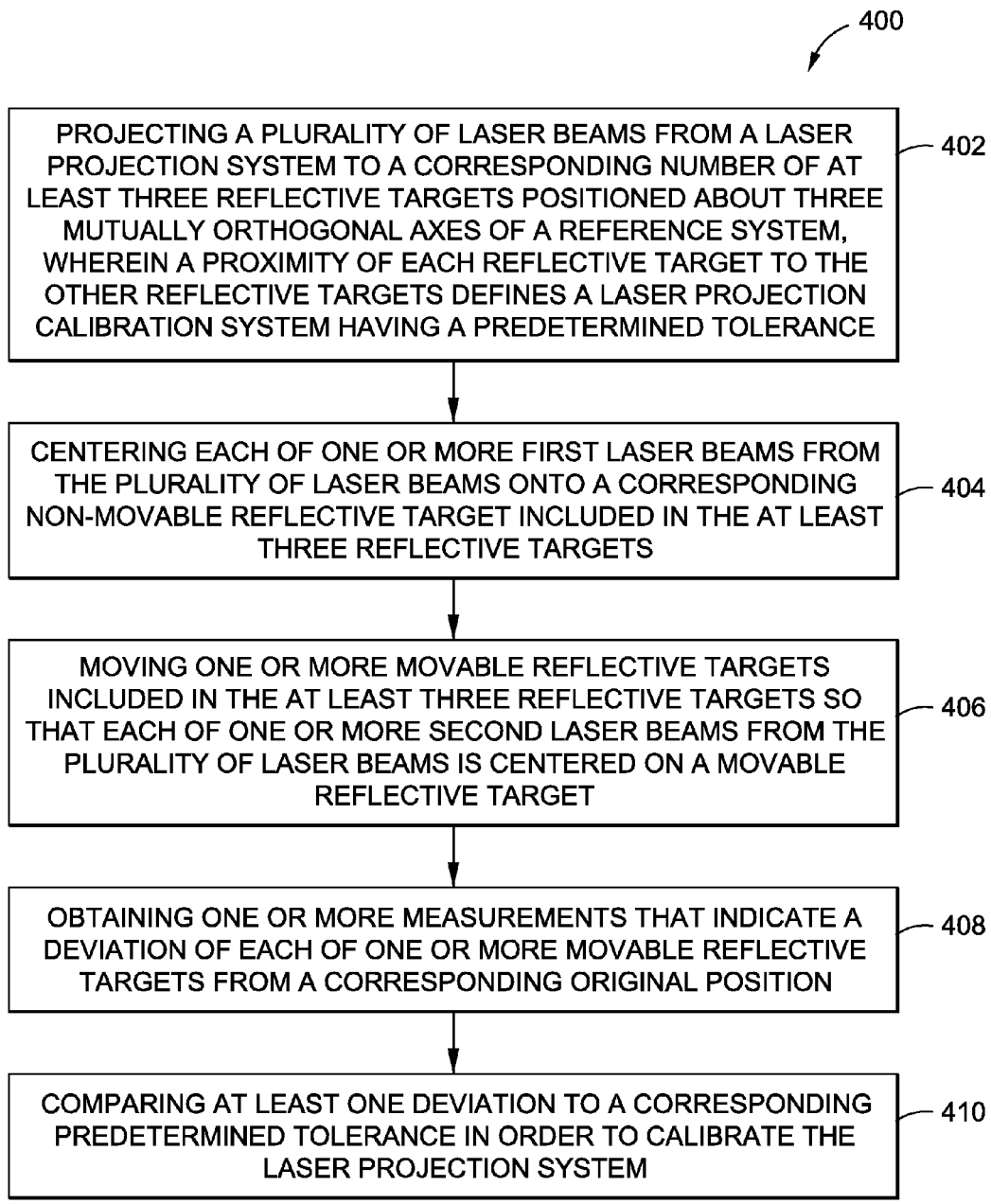
FIG. 8 is an illustration of a flow diagram of one of the embodiments of a method of the disclosure.

Now referring to the Figures, FIG. 1 is an illustration of a side elevational view of an aircraft 10 that includes components that may be assembled or manufactured using laser projection systems calibrated by one or more advantageous embodiments of an apparatus 200 (see FIGS. 6A, 9) or apparatus 300 (see FIGS. 7A, 9), a three-dimensional enhanced laser projection calibration volume system 203 (see FIGS. 6D, 10) or system 303 (see FIGS. 7B, 10), and a method 400 (see FIG. 8). As shown in FIG. 1, the aircraft 10 comprises a fuselage 12, one or more propulsion units 14, wing assemblies 16, a tail assembly 18, a landing assembly 20, a control system (not visible), and a host of other systems and subsystems that enable proper operation of the aircraft 10. For example, at least a portion of the wing assemblies 16 may include one or more components that may be assembled or manufactured using laser projection systems calibrated by one or more advantageous embodiments of an apparatus 200 (see FIGS. 6A, 9) or apparatus 300 (see FIGS. 7A, 9), a three-dimensional enhanced laser projection calibration volume system 203 (see FIGS. 6D, 10) or system 303 (see FIGS. 7B, 10), and a method 400 (see FIG. 8). Although the aircraft 10 shown in FIG. 1 is generally representative of a commercial passenger aircraft, the teachings of the disclosed embodiments may be applied to other passenger aircraft, cargo aircraft, military aircraft, rotorcraft, and other types of aircraft or aerial vehicles, as well as aerospace vehicles, satellites, space launch vehicles, rockets, and other aerospace vehicles, as well as boats and other watercraft, trains, automobiles, trucks, buses, buildings, bridges, or other suitable structures.

Figure 2:
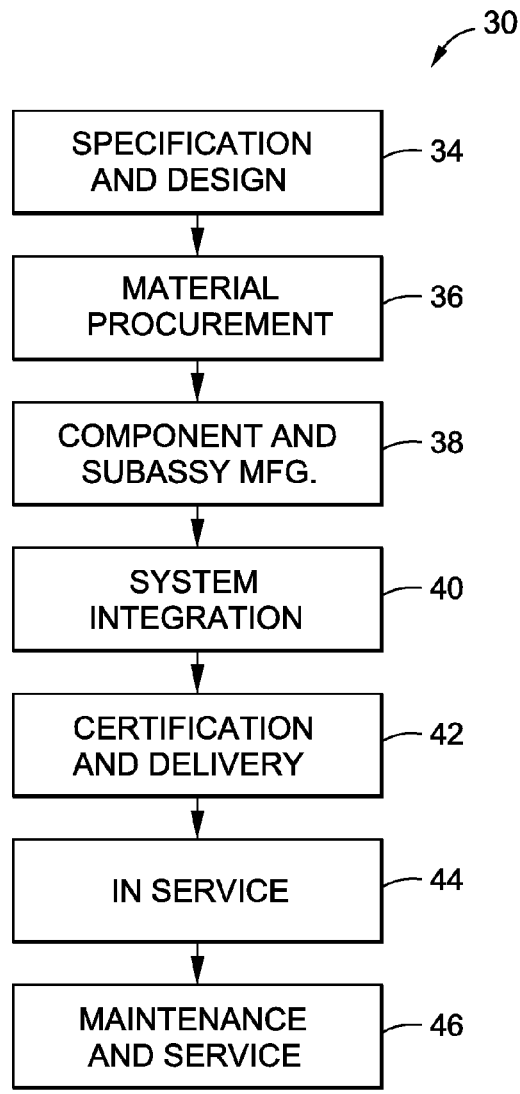
FIG. 2 is an illustration of a flow diagram of an aircraft manufacturing and service method.
Figure 3:
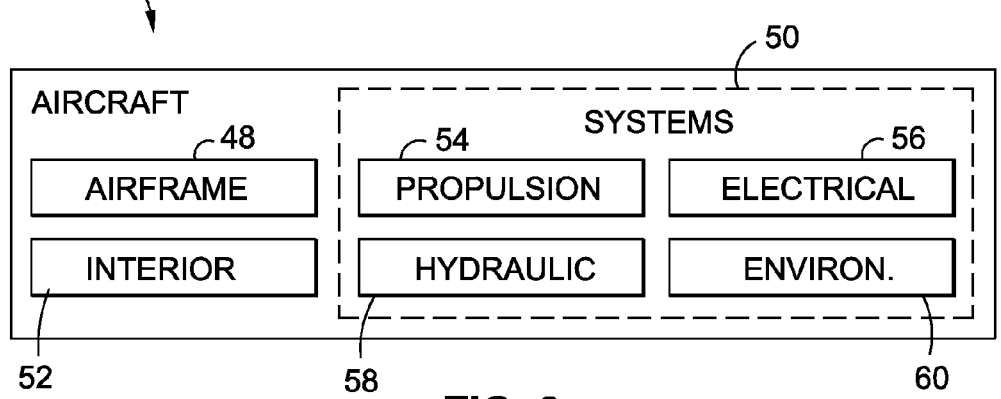
FIG. 3 is an illustration of a block diagram of an aircraft produced according to the manufacturing and service method described in FIG. 2.

FIG. 2 is an illustration of a flow diagram of an aircraft manufacturing and service method 30. FIG. 3 is an illustration of a block diagram of an aircraft 32 produced according to the manufacturing and service method 30 described in FIG. 2. Embodiments of this disclosure may be described in the context of the aircraft manufacturing and service method 30 as shown in FIG. 2, and the aircraft 32 as shown in FIG. 3. During pre-production, exemplary method 30 may include specification and design 34 of the aircraft 32 and material procurement 36. During production, component and subassembly manufacturing 38 and system integration 40 of the aircraft 32 takes place. Thereafter, the aircraft 32 may go through certification and delivery 42 in order to be placed in service 44. While in service by a customer, the aircraft 32 is scheduled for routine maintenance and service 46 (which may also include modification, reconfiguration, refurbishment, and so on).

Each of the processes of method 30 may be performed or carried out by a system integrator, a third party, and/or an operator (e.g., a customer). For the purposes of this description, a system integrator may include without limitation any number of aircraft manufacturers and major-system subcontractors; a third party may include without limitation any number of vendors, subcontractors, and suppliers; and an operator may be an airline, leasing company, military entity, service organization, and so on.

As shown in FIG. 3, the aircraft 32 produced by exemplary method 30 may include an airframe 48 with a plurality of systems 50 and an interior 52. Examples of high-level systems include one or more of a propulsion system 54, an electrical system 56, a hydraulic system 58, and an environmental system 60. Any number of other systems may be included. Although an aerospace example is shown, the principles of this disclosure may be applied to other industries, such as the automotive industry.

Apparatuses, systems and methods embodied herein may be employed during any one or more of the stages of the production and service method 30. For example, components or subassemblies corresponding to component and subassembly manufacturing 38 may be fabricated or manufactured in a manner similar to components or subassemblies produced while the aircraft 32 is in service. Also, one or more apparatus embodiments, system embodiments, method embodiments, or a combination thereof, may be utilized during the component and subassembly manufacturing 38 and system integration 40, for example, by substantially expediting assembly of or reducing the cost of an aircraft 32. Similarly, one or more of apparatus embodiments, system embodiments, method embodiments, or a combination thereof, may be utilized while the aircraft 32 is in service, for example and without limitation, to maintenance and service 46.

Figure 4A:
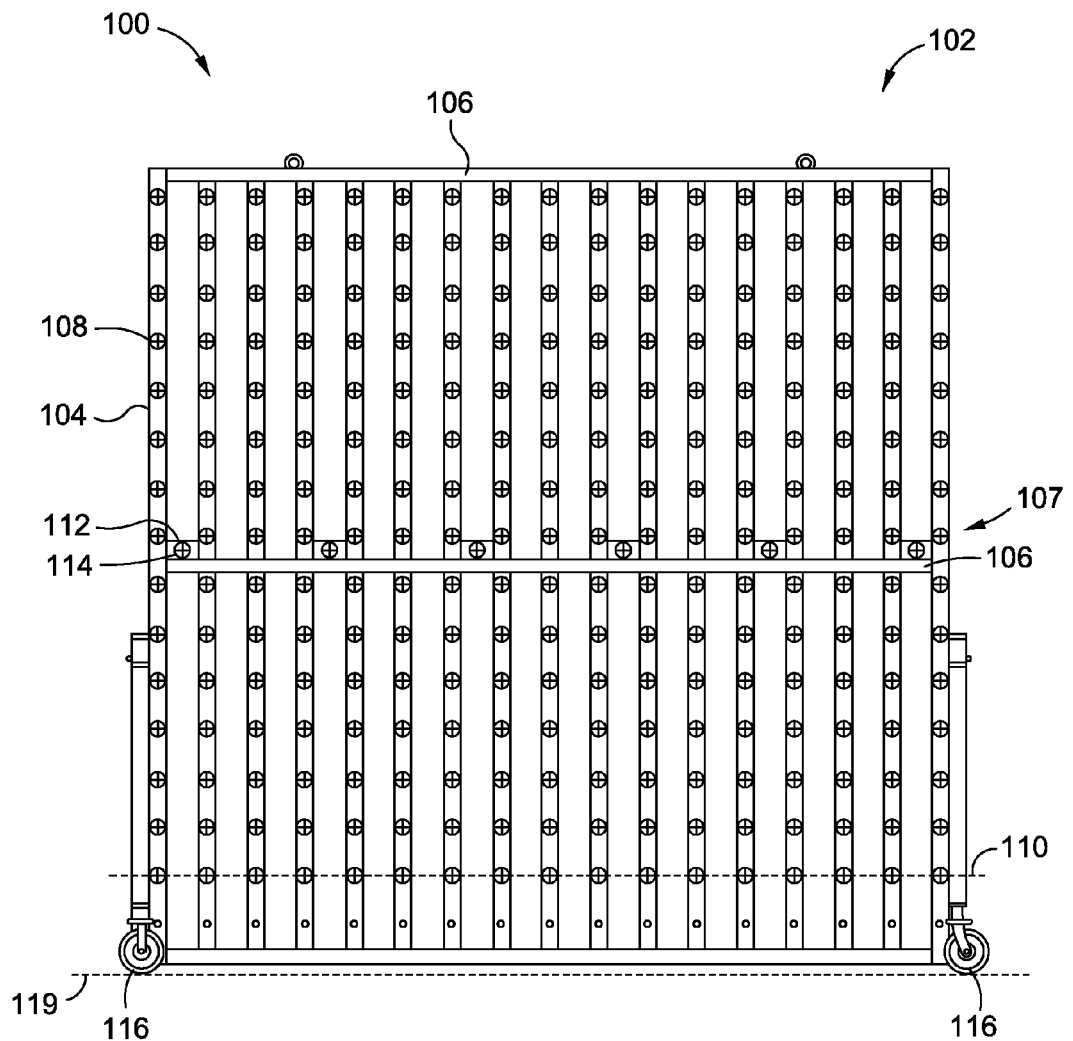
FIG. 4A is an illustration of a front view of a known two-dimensional calibration wall that may be used in embodiments of an apparatus, a system and a method of the disclosure.

FIG. 4A is an illustration of a front view of a known two-dimensional calibration wall 100 that may used in embodiments of an apparatus 200 (see FIGS. 6A, 9) or apparatus 300 (see FIGS. 7A, 9), a three-dimensional enhanced laser projection calibration volume system 203 (see FIGS. 6D, 10) or system 303 (see FIGS. 7B, 10), and a method 400 (see FIG. 8). The two-dimensional calibration wall 100 (see FIG. 4D) is more fully described in U.S. Pat. No. 7,965,396 B2 ("Enhanced Laser Projector Calibration Wall"), commonly owned by applicant, which is incorporated herein by reference in its entirety.

As shown in FIG. 4A, the two-dimensional calibration wall 100 comprises a structural frame 102 having one or more upright structural members 104 and one or more lateral structural members 106 that intersect to form a cross-member frame 107. As further shown in FIG. 4A, the two-dimensional calibration wall 100 comprises a plurality of fixed or non-movable reflective targets 108, one or more positioning stages 112, and one or more wheels 116 coupled to the structural frame 102.

Figure 4B:
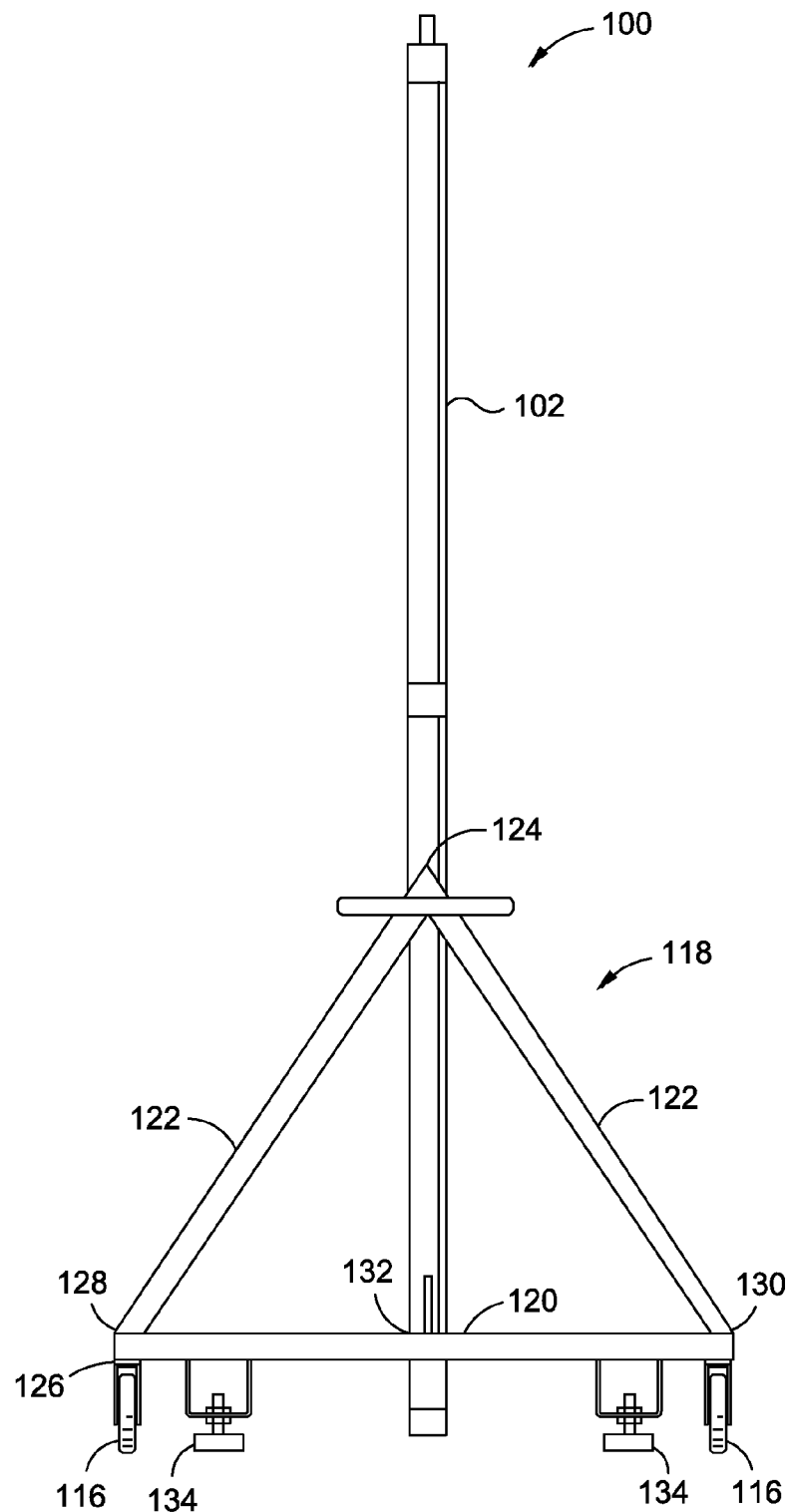
FIG. 4B is an illustration of a side view of the known two-dimensional calibration wall of FIG. 4A.

FIG. 4B is an illustration of a side view of the known two-dimensional calibration wall 100 of FIG. 4A. As shown in FIG. 4B, the two-dimensional calibration wall 100 comprises at least one structural support 118 having a base member 120 and two bracing members 122. The base member 120 is attached to the structural frame 102 at an attachment point 124 and is attached to the wheel 116 at an attachment point 126. The two bracing members 122 may be attached to the base member 120 at attachment points 128 and 130, respectively. Additionally, the bracing members 122 may be further coupled to the structural frame 102 at an attachment point 132 to hold the structural frame 102 in an upright position. As further shown in FIG. 4B, the two-dimensional calibration wall 100 may include one or more adjustable jack stands 134.

Figure 4C:
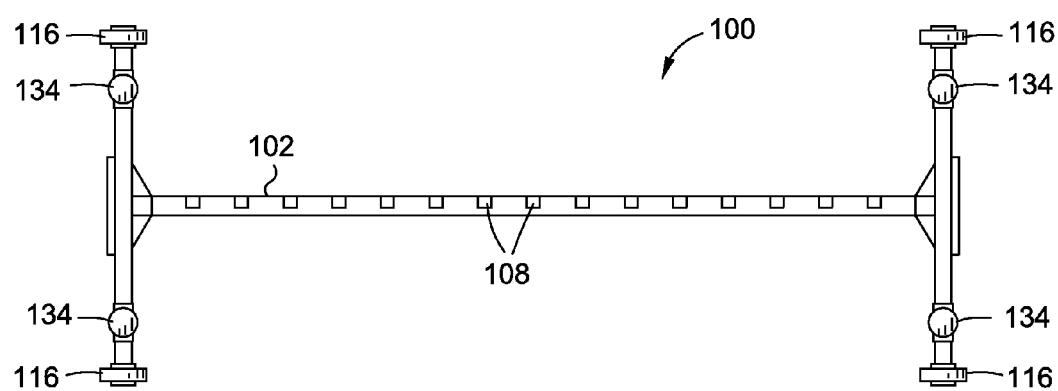
FIG. 4C is an illustration of a bottom view of the known two-dimensional calibration wall of FIG. 4A.

FIG. 4C is an illustration of a bottom view of the known two-dimensional calibration wall 100 of FIG. 4A. As shown in FIG. 4C, the at least one jack stand 134 may be positioned proximate the one or more wheels 116. The non-movable reflective targets 108 are mounted on the structural frame 102. The various components 102-108 and 112-134 of the two-dimensional calibration wall 100 may be coupled together by a multitude of techniques, including, but not limited to, magnetic mounts, frictional mounts, mechanical fasteners, adhesives, welding, soldering, carbon fiber lay-ups, and molding, or another suitable technique or device.

Figure 4D:
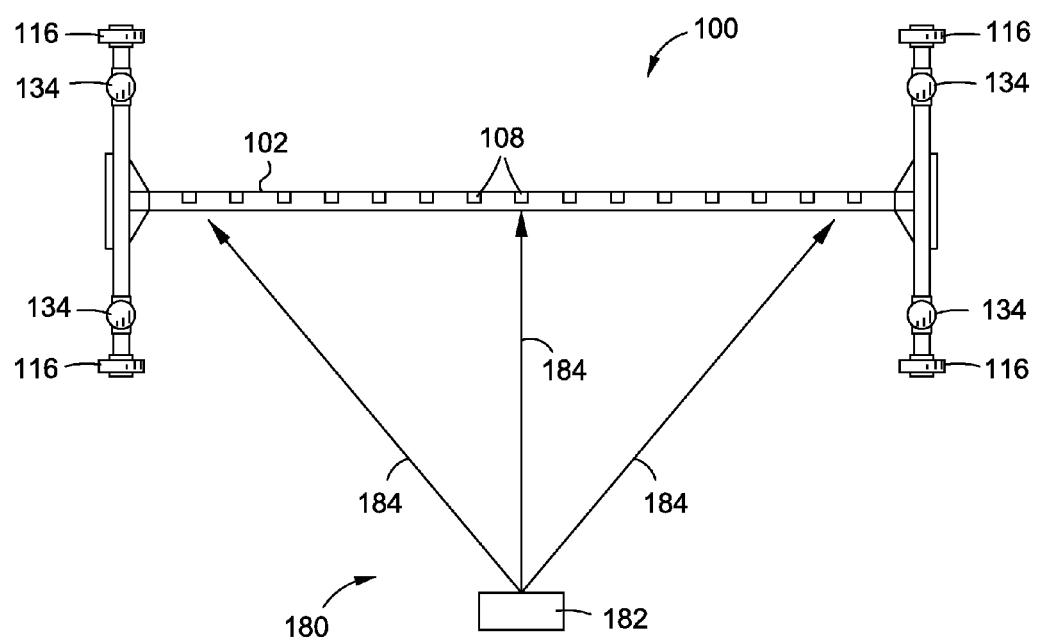
FIG. 4D is an illustration of a bottom view of the known two-dimensional calibration wall of FIG. 4C and a laser projection system.

FIG. 4D is an illustration of a bottom view of the known two-dimensional calibration wall 100 of FIG. 4C used for two-dimensional calibration of a laser projection system 180. The laser projection system 180 comprises a laser projector apparatus 182 that projects a plurality of laser beams 184 to various non-movable reflective targets 108 mounted on the structural frame 102.

Figure 6A:
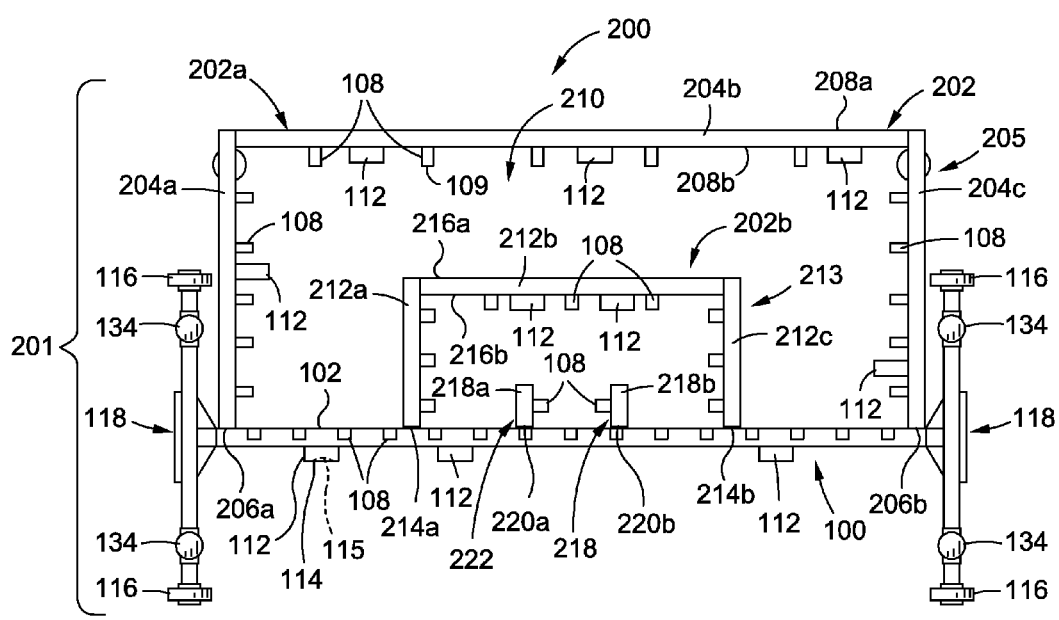
FIG. 6A is an illustration of a bottom view of one of the embodiments of an exemplary apparatus of the disclosure.
Figure 9:
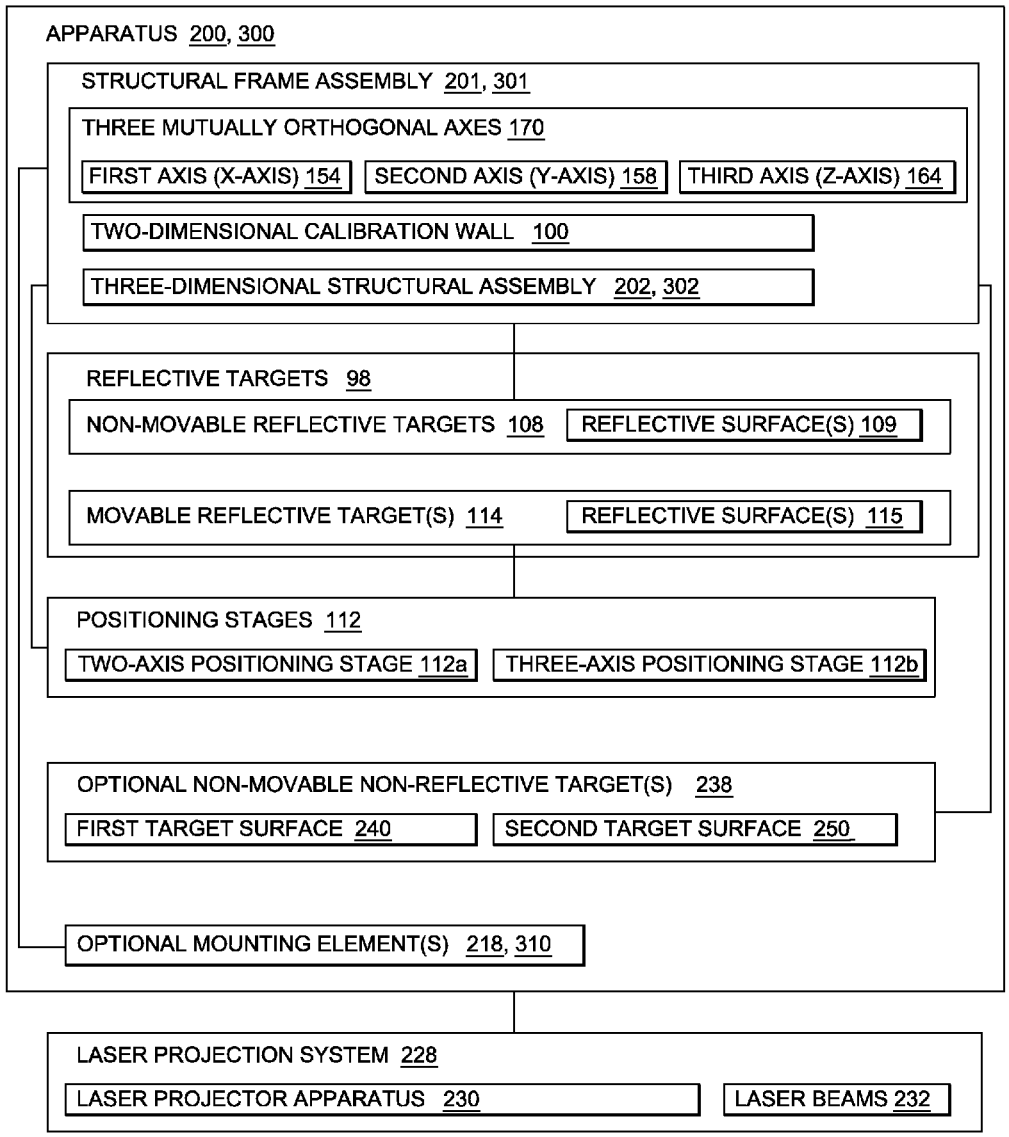
FIG. 9 is an illustration of a block diagram showing one of the embodiments of an apparatus of the disclosure; and, FIG. 10 is an illustration of a block diagram showing one of the embodiments of a system of the disclosure.

Disclosed herein are exemplary embodiments of novel designs of an apparatus 200 (see FIGS. 6A, 9) or apparatus 300 (see FIGS. 7A, 9), a three-dimensional enhanced laser projection calibration volume system 203 (see FIGS. 6D, 10) or system 303 (see FIGS. 7B, 10), and a method 400 (see FIG. 8). FIG. 6A is an illustration of a bottom view of one of the embodiments of an exemplary apparatus 200 of the disclosure. FIG. 9 is an illustration of a block diagram showing apparatus 200 of the disclosure. In an embodiment of the disclosure, there is provided an apparatus 200 (see FIGS. 6A, 9) having three-dimensional measurement capability and enabling three-dimensional laser projection system calibrations for calibrating a laser projection system 228 (see FIG. 6D). As shown in FIGS. 6A, 9, the apparatus 200 comprises a structural frame assembly 201 extending along three mutually orthogonal axes 170 (see FIG. 9). The three mutually orthogonal axes 170 preferably comprise a first axis (x-axis) 154 (see FIGS. 5B, 5D, 9), a second axis (y-axis) 158 (see FIGS. 5B, 5D, 9), and a third axis (z-axis) 164 (see FIGS. 5B, 5D, 9).

As shown in FIGS. 6A, 9, the structural frame assembly 201 comprises a two-dimensional calibration wall 100. As shown in FIG. 6A, the two-dimensional calibration wall 100 comprises a structural frame 102 and a pair of structural supports 118 having one or more wheels 116 and one or more adjustable jack stands 134. An embodiment of the two-dimensional calibration wall 100 that may be used in the structural frame assembly 201 is discussed in detail above and more fully described in U.S. Pat. No. 7,965,396 B2 ("Enhanced Laser Projector Calibration Wall"), which is incorporated herein by reference in its entirety.

As shown in FIG. 6A, the structural frame assembly 201 further comprises a three-dimensional structural assembly 202. In this embodiment, as shown in FIG. 6A, the three-dimensional structural assembly 202 may comprise a first three-dimensional structural assembly 202a and a second three-dimensional structural assembly 202b. The first three-dimensional structural assembly 202a may comprise structural members 204a, 204b, and 204c that form an outer box configuration 205 when attached to and extended from the structural frame 102 of the two-dimensional calibration wall 100. As further shown in FIG. 6A, the structural member 204a may be coupled to the structural frame 102 of the two-dimensional calibration wall 100 at an attachment point 206a, and the structural member 204c may be coupled to the structural frame 102 of the two-dimensional calibration wall 100 at an attachment point 206b. The structural member 204b may be coupled between structural members 204a, 204c. The first three-dimensional structural assembly 202a comprises an exterior portion 208a and an interior portion 208b. In this embodiment, the three-dimensional structural assembly 202 extends behind or to the rear of the two-dimensional calibration wall 100 at rear area 210.

As further shown in FIG. 6A, the second three-dimensional structural assembly 202b may further comprise structural members 212a, 212b, and 212c that form an inner box configuration 213 when attached to and extended from the structural frame 102 of the two-dimensional calibration wall 100. As further shown in FIG. 6A, the structural member 212a may be coupled to the structural frame 102 of the two-dimensional calibration wall 100 at an attachment point 214a, and the structural member 212c may be coupled to the structural frame 102 of the two-dimensional calibration wall 100 at an attachment point 214b. The structural member 212b may be coupled between structural members 212a, 212c. The second three-dimensional structural assembly 202b comprises an exterior portion 216a and an interior portion 216b.

As shown in FIGS. 6A, 9, the apparatus 200 further comprises a plurality of reflective targets 98 (see FIG. 9). The reflective targets 98 preferably comprise a plurality of non-movable reflective targets 108 each having a reflective surface 109, and preferably comprise one or more movable reflective target(s) 114 each having a reflective surface 115. Each reflective surface 109 of the non-movable reflective targets 108 is preferably configured to reflect laser radiation such as from laser beams 232 (see FIG. 6D). For example, the non-movable reflective target 108 may include an assortment of retro-reflective laser targets manufactured by Hubbs Machine & Manufacturing Inc. of Cedar Hill, Mo. However, non-movable laser reflective targets of other types and manufacturers may be implemented in alternative embodiments.

The non-movable reflective targets 108 are preferably disposed on various areas of the structural frame assembly 201. According to various embodiments, the non-movable reflective targets 108 may be mounted on the structural frame 102 of the two-dimensional calibration wall 100, may be mounted on the first three-dimensional structural assembly 202a, and/or may be mounted on the second three-dimensional structural assembly 202b. The non-movable reflective targets 108 may be mounted in such a way that each reflective surface 109 of each non-movable reflective target 108 lies in the same plane, or as nearly in the same plane, as possible. For example, the non-movable reflective targets 108 mounted on the structural frame 102 of the two-dimensional calibration wall 100 may be formed into linear alignment, such as illustrated by alignment line 110 (see FIG. 6B). Such mounting techniques may serve to facilitate the proper calibration of a laser projection system 228 (see FIG. 6D).

As shown in FIG. 6A, the non-movable reflective targets 108 may be mounted directly on the various structural members 204a, 204b, and 204c of the first three-dimensional structural assembly 202a and/or may be mounted directly on the various structural members 212a, 212b, and 212c of the second three-dimensional structural assembly 202b. In other instances, the non-movable reflective targets 108 may be mounted to intermediary components (not shown) that are mounted on the various structural members 204a, 204b, and 204c of the first three-dimensional structural assembly 202a and/or on the various structural members 212a, 212b, and 212c of the second three-dimensional structural assembly 202b.

As shown in FIGS. 6A, 9, the apparatus 200 further comprises at least three positioning stages 112 coupled to the structural frame assembly 201 respectively about each of the three mutually orthogonal axes 170 (see FIG. 9). At least one movable reflective target 114 (see FIGS. 6A, 6B) is preferably disposed on each positioning stage 112. As used herein, "movable" denotes the fact that the movable reflective targets 114 are capable of movement relative to the structural frame 102 and/or the three-dimensional structural assembly 202 because the movable reflective targets 114 are mounted on the positioning stages 112. Each movable reflective target 114 has a reflective surface 115 (see FIGS. 6A, 6B). Each reflective surface 115 of the movable reflective targets 114 is preferably configured to reflect a laser beam 232 (see FIG. 6D) from a laser projection system 228 (see FIG. 6D). The movable reflective targets 114 may be of the same type as the non-movable reflective targets 108. For example, the movable reflective target 114 may include an assortment of retro-reflective laser targets manufactured by Hubbs Machine & Manufacturing Inc. of Cedar Hill, Mo. However, movable laser reflective targets of other types and manufacturers may be implemented in alternative embodiments.

As shown in FIG. 6A, the one or more positioning stages 112 may be coupled to the structural frame 102 of the two-dimensional calibration wall 100, may be coupled to the first three-dimensional structural assembly 202a, and/or may be coupled to the second three-dimensional structural assembly 202b. In one embodiment, the positioning stage 112 may comprise a two-axis positioning stage 112a (see FIG. 5A). In another embodiment, the positioning stage 112 may comprise a three-axis positioning stage 112b (see FIG. 5C). In other embodiments, the positioning stage 112 may comprise another suitable positioning stage.

FIG. 5A is an illustration of a two-axis positioning stage 112a that may be used in embodiments of an apparatus 200 (see FIG. 6A) or apparatus 300 (see FIG. 7A), a three-dimensional enhanced laser projection calibration volume system 203 (see FIG. 6D) or system 303 (see FIG. 7B), and a method 400 (see FIG. 8). FIG. 5A shows a movable reflective target 114 having a reflective surface 115 mounted on a positioning stage 112, the positioning stage 112 being in the form of a two-axis positioning stage 112a. FIG. 5B is an illustration of an x-y axis 155 having a first axis 154, such as an x-axis (left-to-right), and having a second axis 158, such as a y-axis (up-and-down).

As shown in FIG. 5A, the positioning stage 112, in the form of the two-axis positioning stage 112a, is mounted on a two-dimensional calibration wall 100 having non-movable reflective targets 108. The positioning stage 112, in the form of the two-axis positioning stage 112a, may comprise a stage assembly portion 150, a first lateral movement portion 152 coupled to the stage assembly portion 150, and a second lateral movement portion 156 coupled to the stage assembly portion 150. The first lateral movement portion 152 moves laterally relative to a base 153 of the positioning stage 112a, along the first axis 154, such as x-axis (left-to-right), and the second lateral movement portion 156 moves laterally relative to the first lateral movement portion 152, along the second axis 158, such as y-axis (up-and-down). In this embodiment, the second axis 158 may be perpendicular to the first axis 154. The two-axis positioning stage 112a may further comprise a first micrometer 160a coupled to the first lateral movement portion 152 and a second micrometer 160b coupled to the second lateral movement portion 156. The first and second micrometers 160a, 160b are preferably configured to measure the lateral displacement of the first and second lateral movement portions 152, 156, respectively, with respect to a pre-designated starting point or original position. The first and second micrometers 160a, 106b may be manually operated or motorized, such as with powered actuators. It will be appreciated that the powered actuators may include, but are not limited to, electromechanical actuators, hydraulic actuators, pneumatic actuators, or another suitable powered actuator. An exemplary two-axis positioning stage 112a suitable for use as a positioning stage 112 may include the 460A-XY model Low-Profile Integrated Ball Bearing Linear Stages manufactured by the Newport Corporation of Irvine, Calif. However, two-axis positioning stages of other types and manufacturers may be also implemented in alternative embodiments.

FIG. 5C is an illustration of a three-axis positioning stage 112b that may used in embodiments of an apparatus 200 (see FIG. 6A) or apparatus 300 (see FIG. 7A), a three-dimensional enhanced laser projection calibration volume system 203 (see FIG. 6D) or system 303 (see FIG. 7B), and a method 400 (see FIG. 8). FIG. 5C shows movable reflective targets 114 each having a reflective surface 115 mounted on a positioning stage 112, in the form of a three-axis positioning stage 112a. FIG. 5D is an illustration of an x-y-z axis 157 having a first axis 154, such as an x-axis (left-to-right), having a second axis 158, such as a y-axis (up-and-down), and having a third axis 164, such as a z-axis (in-and-out). As shown in FIG. 5C, the positioning stage 112, in the form of the three-axis positioning stage 112b, may comprise the stage assembly portion 150, the first lateral movement portion 152 coupled to the stage assembly portion 150, the second lateral movement portion 156 coupled to the stage assembly portion 150, and a third lateral movement portion 162 coupled to the stage assembly portion 150. The first lateral movement portion 152 moves laterally relative to the base surface 153 of the three-axis positioning stage 112b, along the first axis 154, such as x-axis (left-top-right). The second lateral movement portion 156 moves laterally relative to the first lateral movement portion 152, along the second axis 158, such as a y-axis (up-and-down). The third lateral movement portion 162 moves laterally relative to the second lateral movement portion 156, along the third axis 164, such as z-axis (in-and-out). In this embodiment, the second axis 158 may be perpendicular to the first axis 154, and the third axis 164 may be perpendicular to both the first axis 154 and the second axis 158. The three-axis positioning stage 112b may further comprise a first micrometer 160a coupled to the first lateral movement portion 152, a second micrometer 160b coupled to the second lateral movement portion 156, and a third micrometer 160c coupled to the third lateral movement portion 162. The first, second, and third micrometers 160a, 160b, 160c, respectively, are preferably configured to measure the lateral displacement or movement of the first, second, and third lateral movement portions 152, 156, 162, respectively, with respect to a pre-designated starting point or original position. The first, second, and third micrometers 160a, 106b, 160c may be manually operated or motorized, such as with powered actuators. It will be appreciated that the powered actuators may include, but are not limited to, electromechanical actuators, hydraulic actuators, pneumatic actuators, or another suitable powered actuator. An exemplary three-axis positioning stage 112b suitable for use as a positioning stage 112 may include the 460A-XYZ model Low-Profile Integrated Ball Bearing Linear Stages manufactured by the Newport Corporation of Irvine, Calif. However, three-axis positioning stages of other types and manufacturers may be also implemented in alternative embodiments.

Each positioning stage 112 is preferably a multiple-axis positioning stage 113 (see FIGS. 5A, 5C). More preferably, each of the at least three positioning stages 112 is one of a two-axis positioning stage 112a (see FIG. 5A) or a three-axis positioning stage 112b (see FIG. 5C). In accordance with various implementations, the one or more positioning stages 112, such as in the form of two-axis positioning stage 112a (see FIG. 5A) and three-axis positioning stage 112b, are preferably coupled to the structural frame 102 and/or the three-dimensional structural assembly 202 via the base 153 of the two-axis positioning stage 112a and the three-axis positioning stage 112b positioning stage (see FIGS. 5A, 5C), thereby enabling the first and second lateral movement portions 152 and 156, respectively, of the two-axis positioning stage 112a, and the first, second, and third lateral movement portions 152, 156, and 162, respectively, of the three-axis positioning stage 112b, to move unhindered.

As shown in FIGS. 6A, 9, the apparatus 200 may further comprise a mounting element 218. The mounting element 218 may comprise first mounting element 218a and second mounting element 218b (see FIG. 6A), each coupled to the structural frame assembly 201. As shown in FIG. 6A, the first mounting element 218a may be coupled to the structural frame 102 of the two-dimensional calibration wall 100 at an attachment point 220a, and the second mounting element 218b may be coupled to the structural frame 102 of the two-dimensional calibration wall 100 at an attachment point 220b. However, the first and second mounting elements 218a, 218b may also be mounted to other portions of the structural frame assembly 201, where needed, if additional areas of measurement are desired. The first and second mounting elements 218a, 218b may each have one or more non-movable reflective targets 108 (see FIG. 6A) mounted to the respective first and second mounting elements 218a, 218b. As shown in FIG. 6A, the first and second mounting elements 218a, 218b may be added so that the non-movable reflective targets 108 may be positioned at a center portion 222 of the area to be measured.

Figure 6B:
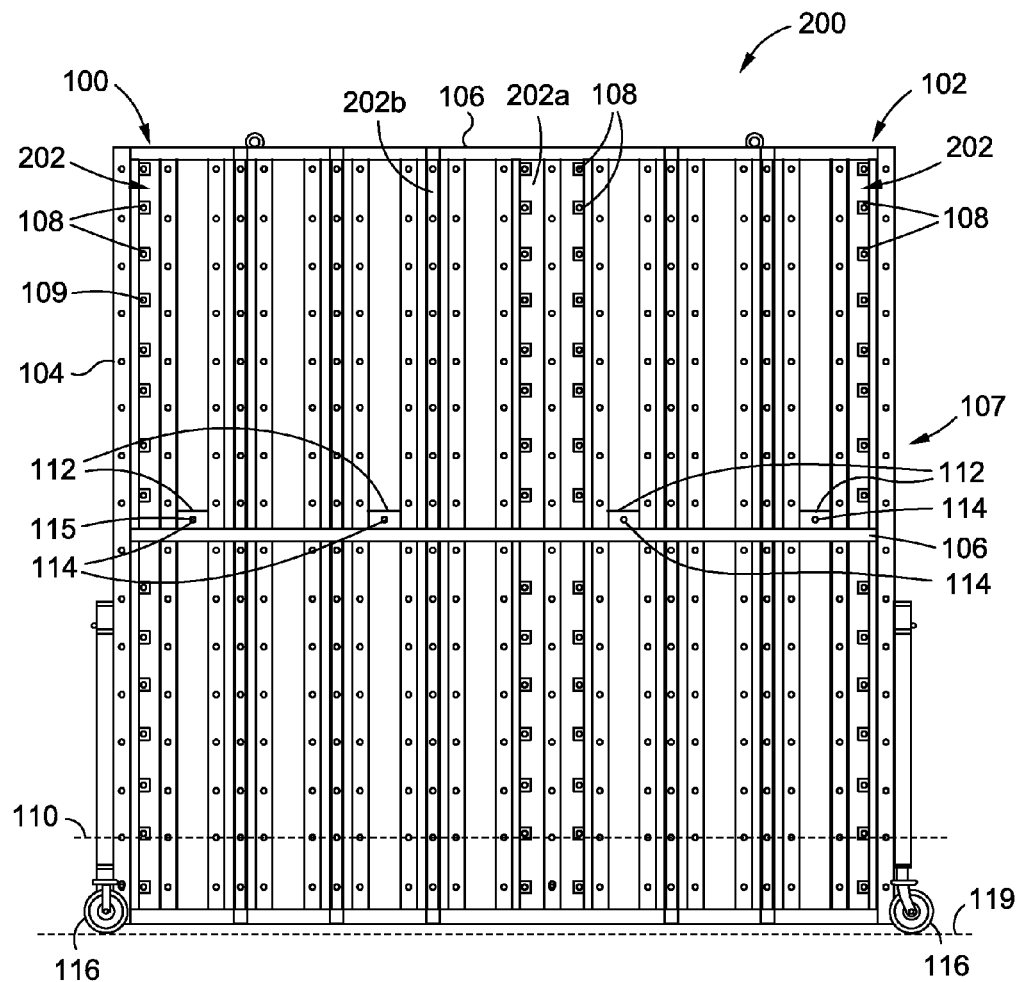
FIG. 6B is an illustration of a front view of the apparatus of FIG. 6A.

FIG. 6B is an illustration of a front view of the apparatus 200 of FIG. 6A. FIG. 6B shows the apparatus 200 comprising the structural frame assembly 201. The structural frame assembly 201 comprises the two-dimensional calibration wall 100 and the three-dimensional structural assembly 202. FIG. 6B shows the first three-dimensional structural assembly 202a and the second three-dimensional structural assembly 202b both having non-movable reflective targets 108. FIG. 6B further shows the structural frame 102 having one or more upright structural members 104 and one or more lateral structural members 106 that intersect to form a cross-member frame 107. The one or more upright structural members 104, the one or more lateral structural members 106, and the three-dimensional structural assembly 202 may be linear, or substantially linear.

The one or more upright structural members 104, the one or more lateral structural members 106, and the three-dimensional structural assembly 202 may be manufactured from various metallic, composite, natural, or hybrid materials, such as, but not limited to, wood, steel, aluminum, polymer, fiberglass, carbon-fiber reinforced plastic (CFRP), and the like. In some embodiments, the one or more upright structural members 104, the one or more lateral structural members 106, and the three-dimensional structural assembly 202 may be coated with a surface treatment that enhances the durability and longevity of the one or more upright structural members 104, the one or more lateral structural members 106, and the three-dimensional structural assembly 202. For example, metallic upright structural members 104, lateral structural members 106, and the three-dimensional structural assembly 202 may be covered with an enamel finish.

In embodiments where the structural frame 102 is formed from multiple upright structural members 104 and multiple lateral structural members 106, at least some of the upright structural members 104 and at least some of the lateral structural members 106 may be disposed perpendicular, or substantially perpendicular, to each other. For example, the one or more upright structural members 104 and the one or more lateral structural members 106 may be configured to form the structural frame 102 with a rectangular configuration. In other embodiments, the structural frame 102 may be constructed from a plurality of upright structural members 104 and lateral structural members 106 that intersect each other at angles other than perpendicular or substantially perpendicular. Moreover, the plurality of upright structural members 104 and lateral structural members 106 may further include linear, substantially linear, and/or non-linear structural members.

As further shown in FIGS. 6B, 9 the apparatus 200 comprises a plurality of non-movable reflective targets 108 disposed on the structural frame assembly 201, at least three positioning stages 112 coupled to the structural frame assembly 201, and at least one movable reflective target 114 disposed on each positioning stage 112. FIG. 6B further shows wheels 116 attached to the structural frame assembly 201.

Figure 6C:
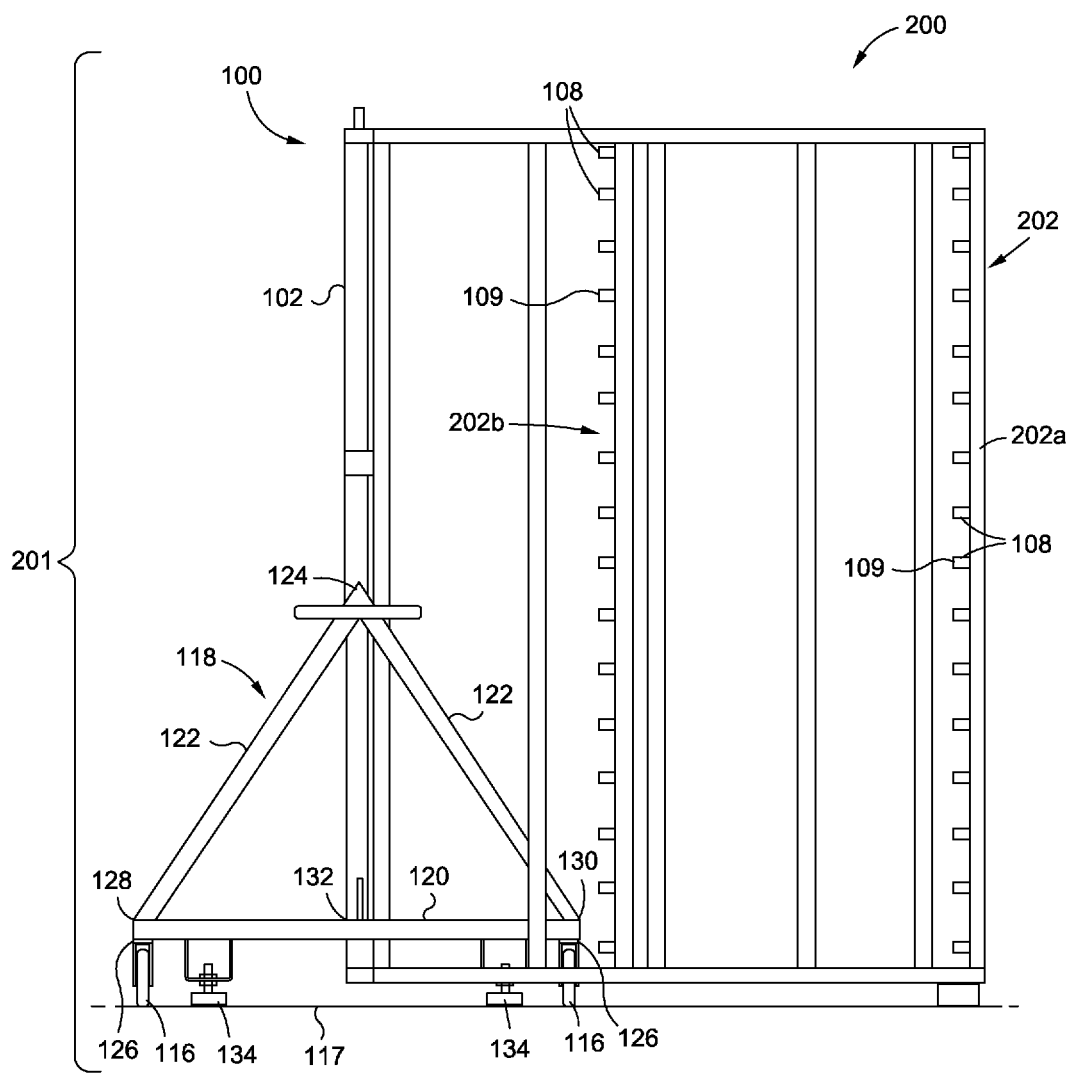
FIG. 6C is an illustration of a side view of the apparatus of FIG. 6A.

FIG. 6C is an illustration of a side view of the apparatus 200 of FIG. 6A. FIG. 6C shows the apparatus 200 comprising the structural frame assembly 201. The structural frame assembly 201 comprises the two-dimensional calibration wall 100 and the three-dimensional structural assembly 202. The two-dimensional calibration wall 100 shows one more wheels 116 that may be attached to the structural frame 102 via at least one structural support 118. The at least one structural support 118 may comprise a base member 120 and two bracing members 122. The base member 120 is preferably configured to provide an attachment point 124 for the structural frame 102, as well as attachment points 126 for the one or more wheels 116. The two bracing members 122 may be attached to the base member 120 at attachment points 128 and 130, respectively. Additionally, the bracing members 122 may be further coupled to the structural frame 102 at an attachment point 132 to hold the structural frame 102 in an upright position.

The combination of the one or more wheels 116 and the at least one structural support 118 may be configured to hold the structural frame 102 in an upright position so that the reflective surfaces 109 (see FIGS. 6B, 6C) of the non-movable reflective targets 108 and the reflective surfaces 115 (see FIG. 6B) of the movable reflective targets 114 (see FIG. 6B) are perpendicular, or substantially perpendicular, to a horizontal surface 119 (see FIG. 6B). In this way, the one or more wheels 116 may facilitate the movement of the two-dimensional calibration wall 100 between locations while the two-dimensional calibration wall 100 is in an upright position.

As further shown in FIG. 6C, the two-dimensional calibration wall 100 may include one or more adjustable jack stands 134 coupled to the two-dimensional calibration wall 100. According to some embodiments, the adjustable jack stand(s) 134 may be coupled to the support structure 118 which is coupled to the structural frame 102. In other embodiments, the adjustable jack stand(s) 134 may be coupled directly to the structural frame 102. The adjustable jack stand(s) 134 may be adjusted to offset the two-dimensional calibration wall 100 against a surface underneath the two-dimensional calibration wall 100, such that at least two non-movable reflective targets 108 are approximately aligned on a line, such as alignment line 110 (FIG. 6B), that is parallel to the horizontal surface 119 (FIG. 6B).

FIG. 6C further shows the first three-dimensional structural assembly 202a and the second three-dimensional structural assembly 202b, both extending from the two-dimensional calibration wall 100. Non-movable reflective targets 108 each having a reflective surface 109 are preferably mounted on the first three-dimensional structural assembly 202a and the second three-dimensional structural assembly 202b.

Figure 6D:
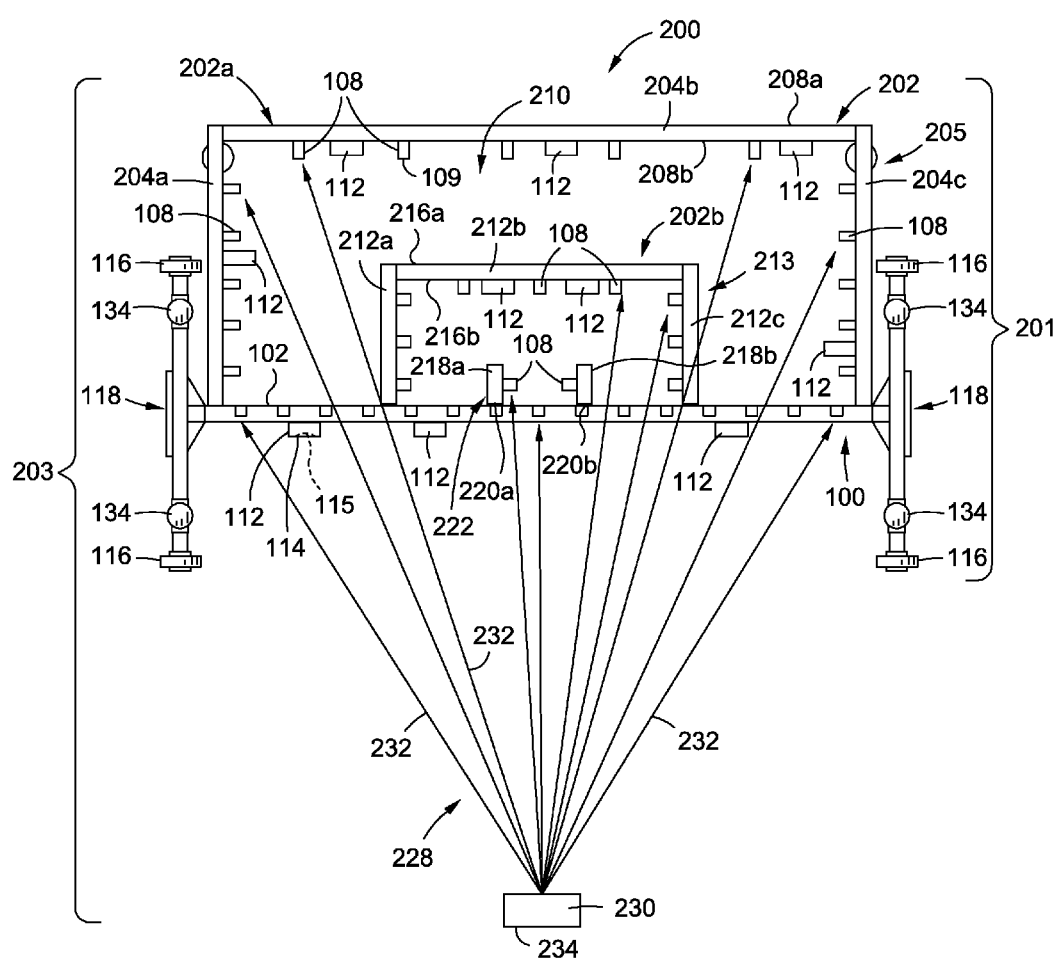
FIG. 6D is an illustration of a bottom view of the apparatus of FIG. 6A and a laser projection system.
Figure 10:
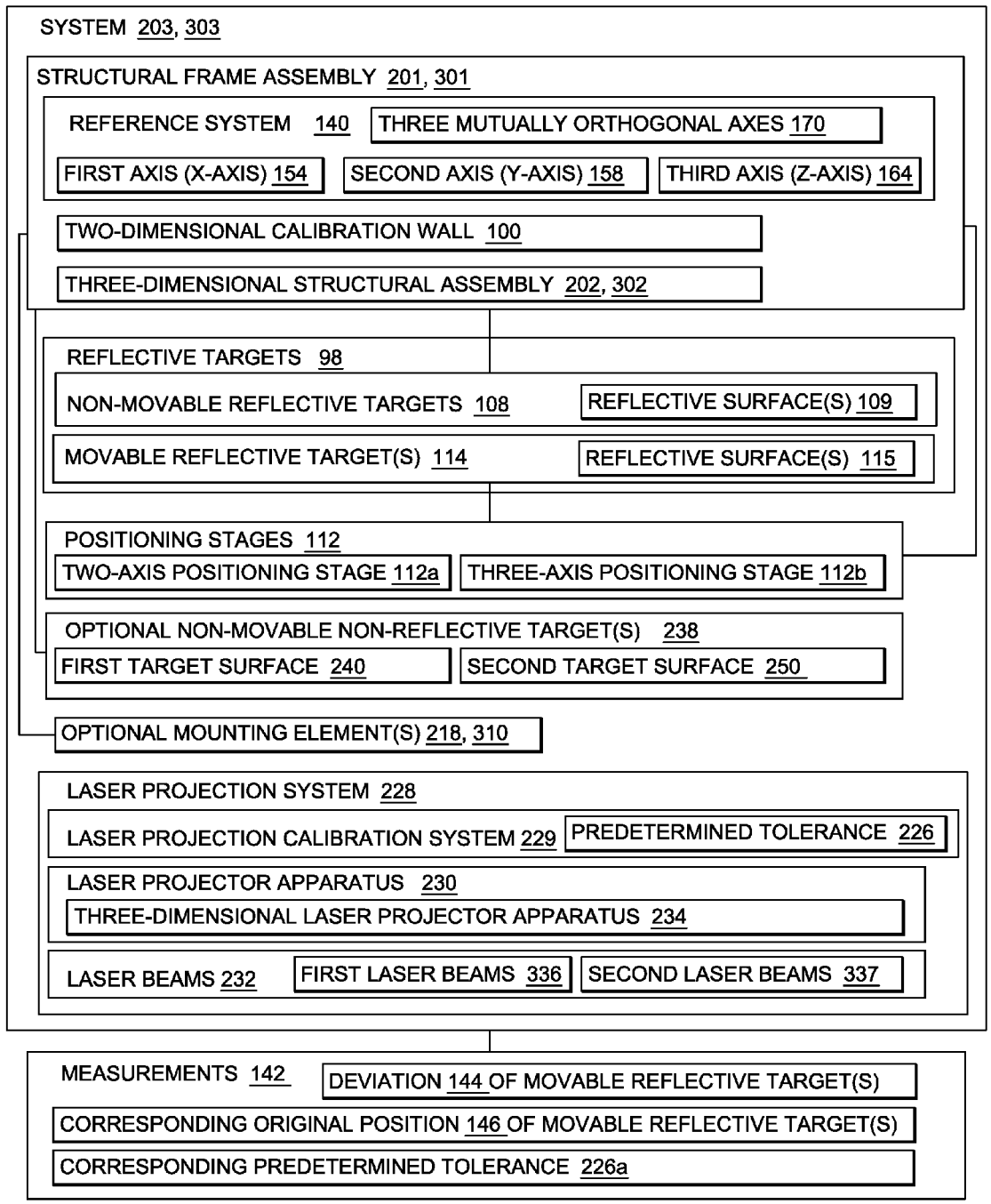

FIG. 6D is an illustration of a bottom view of the apparatus 200 of FIG. 6A and used with a laser projection system 228. In another embodiment of the disclosure, as shown in FIG. 6D, there is provided a three-dimensional enhanced laser projection calibration volume system 203. FIG. 10 is an illustration of a block diagram showing the three-dimensional enhanced laser projection calibration volume system 203 of the disclosure. As shown in FIG. 10, the three-dimensional enhanced laser projection calibration volume system 203 comprises a structural frame assembly 201 extending along three mutually orthogonal axes 170. The structural frame assembly 201 comprises a two-dimensional calibration wall 100, and a three-dimensional structural assembly 202 extending from the calibration wall 100. As shown in FIG. 6D, the three-dimensional structural assembly 202 comprises a first three-dimensional structural assembly 202a and a second three-dimensional structural assembly 202b. FIG. 6D further shows structural members 204a, 204b, and 204c that form the outer box configuration 205 when attached to and extended from the structural frame 102 of the two-dimensional calibration wall 100, and further shows structural members 212a, 212b, and 212c that form an inner box configuration 213 when attached to and extended from the structural frame 102 of the two-dimensional calibration wall 100.

As shown in FIGS. 6D, 10, the three-dimensional enhanced laser projection calibration volume system 203 further comprises a plurality of non-movable reflective targets 108, each having a reflective surface 109, disposed on the structural frame assembly 201 (see FIG. 10). The structural frame assembly 201 further comprises at least three positioning stages 112 (see FIGS. 6D, 10) coupled to the structural frame assembly 201 respectively about each of the three mutually orthogonal axes 170, and at least one movable reflective target 114 (see FIG. 10), having a reflective surface 115 (see FIG. 10), disposed on each positioning stage 112.

As shown in FIGS. 6D, 10, the three-dimensional enhanced laser projection calibration volume system 203 further comprises a laser projection system 228. The laser projection system 228 comprises a laser projector apparatus 230 to be calibrated. Preferably, the laser projector apparatus 230 to be calibrated comprises a three-dimensional laser projector apparatus 234 to be calibrated. The laser projection system 228 further comprises a plurality of laser beams 232 projected from the laser projector apparatus 230 and projected at selected non-movable reflective targets 108 and the at least one movable reflective target 114 (see FIG. 6D). The non-movable reflective targets 108 and the at least one movable reflective target 114 are each configured to reflect a laser beam 232 from the laser projector apparatus 230 of the laser projection system 228. The three-dimensional enhanced laser projection calibration volume system 203 may further comprise one or more mounting elements 218, such as first mounting element 218a and second mounting element 218b. As shown in FIG. 6D, the first mounting element 218a is coupled to the structural frame 102 at attachment point 220a, and the second mounting element 218b is coupled to the structural frame 102 at attachment point 220b.

Figure 6E:
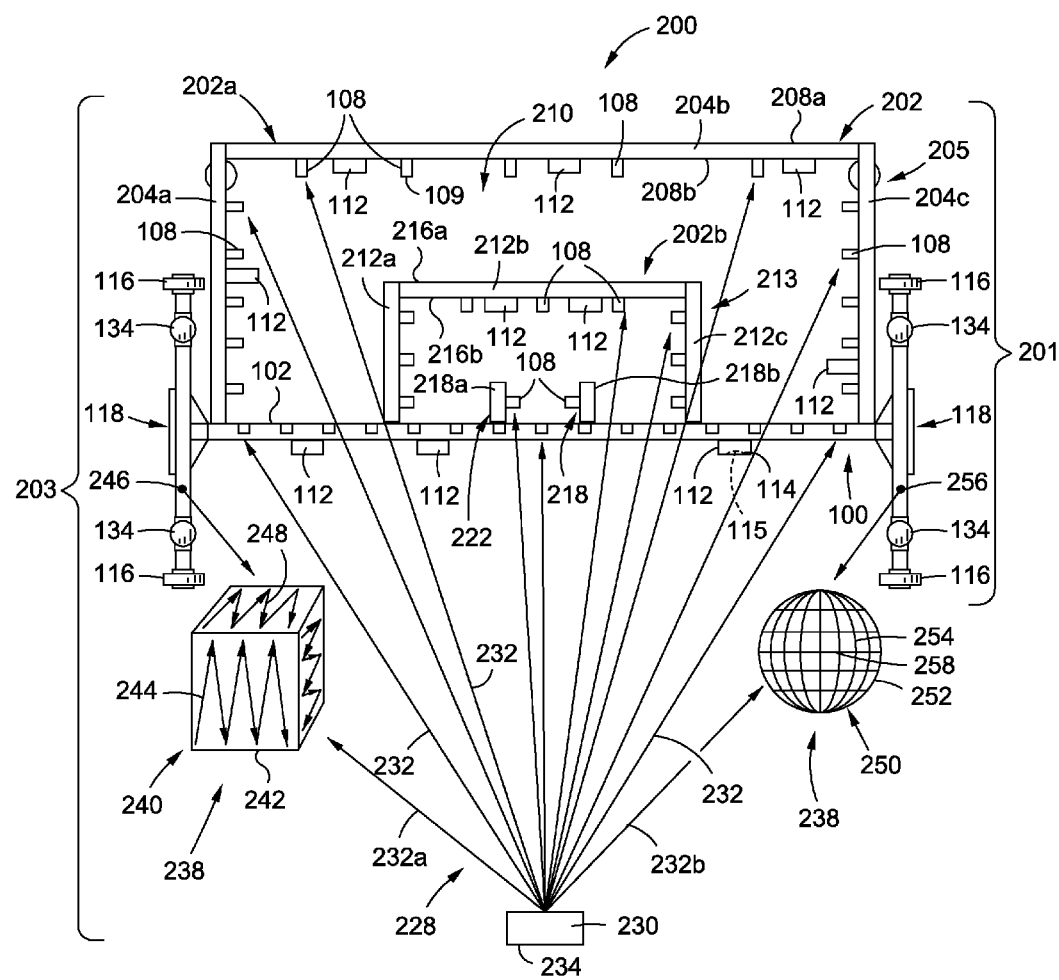
FIG. 6E is an illustration of a bottom view of the apparatus and laser projection system of FIG. 6D where the apparatus includes non-movable non-reflective targets.

FIG. 6E is an illustration of a bottom view of the apparatus 200 and the laser projection system 228 of FIG. 6D where the apparatus 200 may include non-movable non-reflective targets 238. As shown in FIGS. 6E, 9, 10, the apparatus 200 may further comprise at least one non-movable non-reflective target 238 disposed on the structural frame assembly 201. In one embodiment, the at least one non-movable non-reflective target 238 may comprise a first target surface 240 (see FIGS. 6E, 9), such as one or more flat cube surfaces 242 (see FIG. 9). As shown in FIG. 6E, the first target surface 240, such as one or more flat cube surfaces 242, may be disposed on a first portion 246 of the structural frame assembly 201. The first target surface 240, such as one or more flat cube surfaces 242, may comprise a first feature based pattern 244 (see FIG. 6E) and/or a second feature based pattern 248 (see FIG. 6E). In another embodiment, the at least one non-movable non-reflective target 238 may comprise a second target surface 250 (see FIGS. 6E, 9), such as curved sphere surface 252 (see FIG. 6E). As shown in FIG. 6E, the second target surface 250, such as curved sphere surface 252, may be disposed on a second portion 256 of the structural frame assembly 201. The second target surface 250, such as curved sphere surface 252, may comprise a longitude line pattern 254 (see FIG. 6E) and a latitude line pattern 258 (see FIG. 6E). In other embodiments, the at least one non-movable non-reflective target 238 may comprise other suitable target surfaces or shaped surfaces.

The non-movable non-reflective targets 238, preferably in the form of first target surface 240, such as one or more flat cube surfaces 242, and second target surface 250, such as curved sphere surface 252, represent embodiments of surfaces to be fixed in the three-dimensional enhanced laser projection calibration volume system 203 in order to verify the three-dimensional projection performance of the laser projection system 228 and in order to demonstrate the ability of the laser projector apparatus 230 (see FIG. 6E) to project patterns or features, such as, for example, the longitude line pattern 254 and the latitude line pattern 258, to different type surfaces, for example curved surfaces, flat surfaces or other shaped surfaces. Such patterns or features, such as the longitude line pattern 254 and latitude line pattern 258, may be projected on objects or parts to be measured (not shown) in order to verify three-dimensional projection performance. In addition, the non-movable non-reflective targets 238 may serve as targets for the laser projection systems 228 that are capable of feature based measurement. As shown in FIG. 6E, laser beam 232a is projected from the laser projector apparatus 230, such as in the form of three-dimensional laser projector apparatus 234, at the first target surface 240, such as in the form of flat cube surface 242. Further, as shown in FIG. 6E, laser beam 232b is projected from the laser projector apparatus 230, such as in the form of three-dimensional laser projector apparatus 234, at the second target surface 250, such as in the form of curved sphere surface 252.

As shown in FIG. 10, the three-dimensional enhanced laser projection calibration volume system 203 comprises a structural frame assembly 201 extending along three mutually orthogonal axes 170. The structural frame assembly 201 comprises a two-dimensional calibration wall 100 (see FIGS. 6E, 10), and a three-dimensional structural assembly 202 (see FIG. 10) extending from the two-dimensional calibration wall 100. As shown in FIG. 6E, the three-dimensional structural assembly 202 extends behind the two-dimensional calibration wall 100. The structural frame assembly 201 further comprises a plurality of non-movable reflective targets 108 (see FIGS. 6E, 10) each having a reflective surface 109 (see FIGS. 6E, 10) disposed on the structural frame assembly 201. The structural frame assembly 201 further comprises at least three positioning stages 112 (see FIGS. 6E, 10) coupled to the structural frame assembly 201 respectively about each of the three mutually orthogonal axes 170, and at least one movable reflective target 114 (see FIGS. 6E, 10) having a reflective surface 115 (see FIGS. 6E, 10) disposed on each positioning stage 112. The positioning stages 112 may comprise a two-axis positioning stage (see FIG. 10) or a three-axis positioning stage (see FIG. 10). The three-dimensional enhanced laser projection calibration volume system 203 may further comprise non-movable non-reflective targets 238 (see FIGS. 6E, 10) comprising a first target surface 240 (see FIGS. 6E, 10) and/or a second target surface 250 (see FIGS. 6E, 10) disposed on the structural frame assembly 201. The three-dimensional enhanced laser projection calibration volume system 203 may further comprise one or more mounting elements 218 (see FIGS. 6E, 10) mounted on the structural frame assembly 201.

As shown in FIG. 10, the three-dimensional enhanced laser projection calibration volume system 203 further comprises a laser projection system 228. The laser projection system 228 comprises a laser projector apparatus 230 to be calibrated, and a plurality of laser beams 232 projected from the laser projector apparatus 230 and projected at selected non-movable reflective targets 108 and the at least one movable reflective target 114. The non-movable reflective targets 108 and the at least one movable reflective target 114 are each configured to reflect a laser beam 232 from the laser projector apparatus 230 of the laser projection system 228.

FIG. 7A is an illustration of a bottom view of another embodiment of an exemplary apparatus 300 of the disclosure. FIG. 7B is an illustration of a bottom view of the apparatus 300 of FIG. 7A used with a laser projection system 228. FIG. 9 is an illustration of a block diagram showing embodiments of apparatus 300 of the disclosure. FIG. 10 is an illustration of a block diagram showing embodiments of a three-dimensional enhanced laser projection calibration volume system 303.

As shown in FIGS. 7A, 9, the apparatus 300 comprises a structural frame assembly 301 extending along three mutually orthogonal axes 170 (see FIG. 9). The three mutually orthogonal axes 170 preferably comprise a first axis (x-axis) 154 (see FIGS. 5B, 5D, 9), a second axis (y-axis) 158 (see FIGS. 5B, 5D, 9), and a third axis (z-axis) 164 (see FIGS. 5B, 5D, 9).

As shown in FIGS. 7A, 9, the structural frame assembly 301 comprises the two-dimensional calibration wall 100. As shown in FIG. 7A, the two-dimensional calibration wall 100 comprises a structural frame 102 and a pair of structural supports 118 having one or more wheels 116 and one or more adjustable jack stands 134. An embodiment of the two-dimensional calibration wall 100 that may be used in the structural frame assembly 201 is discussed in detail above and more fully described in U.S. Pat. No. 7,965,396 B2 ("Enhanced Laser Projector Calibration Wall"), which is incorporated herein by reference in its entirety.

As shown in FIGS. 7A, 9, the structural frame assembly 301 further comprises a three-dimensional structural assembly 302. In this embodiment, as shown in FIG. 7A, the three-dimensional structural assembly 302 may comprise structural members 303a, 303b that may be coupled to the structural frame 102 of the two-dimensional calibration wall 100 at attachment points 304a, 304b, respectively. The three-dimensional structural assembly 302 may comprise structural members 306a, 306b that may be coupled to the structural frame 102 of the two-dimensional calibration wall 100 at attachment points 308a, 308b, respectively. The three-dimensional structural assembly 302 may further comprise one or more mounting elements 310 (see FIGS. 7A, 9), such as first mounting element 310a and second mounting element 310b (see FIG. 7A) that may be coupled to the structural frame 102 of the two-dimensional calibration wall 100 at attachment points 312a, 312b, respectively. However, the first and second mounting elements 310a, 310b may also be mounted to other portions of the structural frame assembly 301, where needed, if additional areas of measurement are desired. The first and second mounting elements 310a, 310b may be added so that non-movable reflective targets 108 may be positioned at a center portion 222 of an area to be measured. In this embodiment, the three-dimensional structural assembly 302 preferably extends in front of the two-dimensional calibration wall 100 at front area 314.

As shown in FIGS. 7A, 9, the apparatus 300 further comprises a plurality of reflective targets 98 (see FIG. 9). The reflective targets 98 preferably comprise a plurality of non-movable reflective targets 108 (see FIGS. 7A, 9) each having a reflective surface 109 (see FIGS. 7A, 9), and preferably comprise one or more movable reflective target(s) 114 (see FIGS. 7A, 9) each having a reflective surface 115 (see FIGS. 7A, 9). Each reflective surface 109 of the non-movable reflective targets 108 is preferably configured to reflect laser radiation such as from laser beams 232 (see FIG. 7B).

The non-movable reflective targets 108 are preferably disposed on various areas of the structural frame assembly 301. According to various embodiments, the non-movable reflective targets 108 may be mounted on the structural frame 102 of the two-dimensional calibration wall 100 and may be mounted on the three-dimensional structural assembly 302. As shown in FIG. 7A, the non-movable reflective targets 108 may be mounted directly on the various structural members 303a, 303b, 306a and 306b of the three-dimensional structural assembly 302. The non-movable reflective targets 108 may be mounted in such a way that each reflective surface 109 of each non-movable reflective target 108 lies in the same plane, or as nearly in the same plane, as possible.

As shown in FIGS. 7A, 9, the apparatus 300 further comprises at least three positioning stages 112 coupled to the structural frame assembly 301 respectively about each of the three mutually orthogonal axes 170 (see FIG. 9). At least one movable reflective target 114 (see FIGS. 7A, 9) is preferably disposed on each positioning stage 112. Each movable reflective target 114 has a reflective surface 115 (see FIGS. 7A, 9).

As shown in FIG. 7A, the one or more positioning stages 112 may be coupled to the structural frame 102 of the two-dimensional calibration wall 100, and/or may be coupled to the three-dimensional structural assembly 302. In one embodiment, the positioning stage 112 may comprise a two-axis positioning stage 112a (see FIG. 9). In another embodiment, the positioning stage 112 may comprise a three-axis positioning stage 112b (see FIG. 9). In other embodiments, the positioning stage 112 may comprise another suitable positioning stage.

FIG. 7B is an illustration of a bottom view of the apparatus 300 of FIG. 7A used with a laser projection system 228. The laser projection system 228 comprises a laser projector apparatus 230 (see FIG. 7B) to be calibrated. Preferably, the laser projector apparatus 230 to be calibrated comprises a three-dimensional laser projector apparatus 234 (see FIG. 7B) to be calibrated. The laser projection system 228 further comprises a plurality of laser beams 232 (see FIG. 7B) projected from the laser projector apparatus 230 and projected at selected non-movable reflective targets 108 and the at least one movable reflective target 114. The non-movable reflective targets 108 and the at least one movable reflective target 114 are each configured to reflect a laser beam 232 from the laser projector apparatus 230 of the laser projection system 228.

In another embodiment of the disclosure, as shown in FIGS. 7B, 10, there is provided a three-dimensional enhanced laser projection calibration volume system 303. FIG. 10 is an illustration of a block diagram showing the three-dimensional enhanced laser projection calibration volume system 303 of the disclosure. As shown in FIG. 10, the three-dimensional enhanced laser projection calibration volume system 303 comprises a structural frame assembly 301 extending along three mutually orthogonal axes 170. The structural frame assembly 301 comprises a two-dimensional calibration wall 100 and a three-dimensional structural assembly 302 extending from the calibration wall 100. As shown in FIG. 10, the three-dimensional enhanced laser projection calibration volume system 303 comprises reflective targets 98 comprising non-movable reflective targets 108 and movable reflective target(s) 114, positioning stages 112, optional non-movable non-reflective target(s) 238, as discussed above, and optional mounting elements 310. As shown in FIGS. 7B, 10, the three-dimensional enhanced laser projection calibration volume system 303 further comprises a laser projection system 228 with a laser projector apparatus 230, and a plurality of laser beams 232.

In another embodiment of the disclosure, there is provided a method 400 for calibrating a laser projection system 228. FIG. 8 is an illustration of a flow diagram of one of the embodiments of the method 400 of the disclosure. As shown in FIG. 8, the method 400 comprises step 402 of projecting a plurality of laser beams 232 (see FIGS. 6D, 7B, 10) from a laser projection system 228 (see FIGS. 6D, 7B) to a corresponding number of at least three reflective targets 98 (see FIG. 10) positioned about three mutually orthogonal axes 170 (see FIG. 10) of a reference system 140 (see FIG. 10). A proximity of each reflective target 98 to the other reflective targets 98 defines a laser projection calibration system 229 (see FIG. 10) having a predetermined tolerance 226 (see FIG. 10).

The method 400 further comprises step 404 of centering each of one or more first laser beams 336 (see FIG. 10) from the plurality of laser beams 232 (see FIG. 10) onto a corresponding non-movable reflective target 108 (see FIGS. 6D, 7B, 10) included in the at least three reflective targets 98. The method 400 further comprises step 406 of moving one or more movable reflective targets 114 (see FIGS. 6D, 7B, 10) included in the at least three reflective targets 98 so that each of one or more second laser beams 337 (see FIG. 10) from the plurality of laser beams 232 is centered on a movable reflective target 114.

The method 400 further comprises step 408 of obtaining one or more measurements 142 (see FIG. 10) that indicate a deviation 144 (see FIG. 10) of each of the one or more movable reflective targets 114 from a corresponding original position 146 (see FIG. 10) of the movable reflective targets 114. The method 400 further comprises step 410 of comparing at least one deviation 144 (see FIG. 10) to a corresponding predetermined tolerance 226a (see FIG. 10) in order to calibrate the laser projection system 228 (see FIG. 10).

The method 400 may further comprise providing one or more non-movable non-reflective target(s) 238 (see FIGS. 6E, 10) to verify a three-dimensional projection capability onto the one or more non-movable non-reflective targets 238. The method 400 may further comprise determining that the laser projection system 228 is usable if the deviation 144 is within the corresponding predetermined tolerance 226a, and determining that the laser projection system 228 is unusable if at least one deviation 144 is outside one or more corresponding predetermined tolerances 226a. Moving the one or more movable reflective targets 114 includes moving each movable reflective target 114 laterally along a first axis 154 (see FIG. 5B) and laterally along a second axis 158 (see FIG. 5B) that is perpendicular to the first axis 154. Moving the one or more movable reflective targets 114 further includes moving each movable reflective target 114 laterally along a third axis 164 (see FIG. 5D) that is perpendicular to the first axis 154 and perpendicular to the second axis 158. The non-movable reflective targets 108 preferably establish a reference and provide alignment of the laser projection system 228, and the movable reflective targets 114 preferably determine a projection accuracy measurement of the laser projection system 228.

Disclosed embodiments of the apparatuses 200, 300, the three-dimensional enhanced laser projection calibration volume systems 203, 303, and the method 400 provide a three-dimensional measurement capability and enable three-dimensional laser projection system calibrations to calibrate laser projection systems; provide three-dimensional calibration that is more representative of how certain three-dimensional laser projectors, which have increased accuracy and speed and which are able to perform feature based measurements, are used in practice and contain standards to enable additional types of feature based measurements, by getting the basic calibration away from the known two-dimensional calibration wall approach and closer to three-dimensional projections that may be used in manufacturing applications by certain manufacturers; provide a common way to analyze the performance of different manufacturers of laser projection systems having three-dimensional laser projectors; provide an improved capability to calibrate laser projectors in the same manner they are used in manufacturing; allow for entities performing calibrations of laser projectors and laser projector manufacturers wishing to accurately measure their products during design and/or calibration, as they are intended to be used; and provide an apparatus, system and method comprising a known two-dimensional calibration wall 100 with the addition of a structural frame assembly 201 or 301 to create a three-dimensional effect and including movable reflective targets 114 on respective positioning stages 112 to measure deviation 144 or error, and optionally including non-movable non-reflective targets 238 that serve as surfaces for laser projectors to demonstrate their ability to project features such as latitude and longitude lines or serve as targets for the laser projection systems that are capable of feature based measurement.

Many modifications and other embodiments of the disclosure will come to mind to one skilled in the art to which this disclosure pertains having the benefit of the teachings presented in the foregoing descriptions and the associated drawings. The embodiments described herein are meant to be illustrative and are not intended to be limiting or exhaustive. Although specific terms are employed herein, they are used in a generic and descriptive sense only and not for purposes of limitation.

What is claimed is:

1. An apparatus for calibrating a laser projection system, the apparatus comprising:
    a structural frame assembly comprising a two-dimensional calibration wall having a pair of structural supports attached to the two-dimensional calibration wall, and further comprising a three-dimensional structural assembly extending from the two-dimensional calibration wall, the three-dimensional structural assembly comprising a first three-dimensional structural assembly positioned exterior to a second three-dimensional structural assembly;
    a plurality of non-movable reflective targets disposed on the structural frame assembly;
    at least three positioning stages coupled to the structural frame assembly respectively about each of the three mutually orthogonal axes; and
    at least one movable reflective target disposed on each positioning stage,
    wherein the non-movable reflective targets and the at least one movable reflective target are each configured to reflect a laser beam from a laser projection system.

2. The apparatus of claim 1, further comprising at least one non-movable non-reflective target disposed on the structural frame assembly.

3. The apparatus of claim 1, further comprising one or more mounting elements coupled to the structural frame assembly.

4. The apparatus of claim 1, wherein the three-dimensional structural assembly extends behind the two-dimensional calibration wall.

5. The apparatus of claim 1, wherein the three-dimensional structural assembly extends in front of the two-dimensional calibration wall.

6. The apparatus of claim 1, wherein each of the at least three positioning stages is one of a two-axis positioning stage or a three-axis positioning stage.

7. The apparatus of claim 1, wherein the laser projection system comprises a three-dimensional laser projector apparatus to be calibrated by the apparatus.

8. A three-dimensional enhanced laser projection calibration volume system, the system comprising:
    a structural frame assembly extending along three mutually orthogonal axes, the structural frame assembly comprising:
        a two-dimensional calibration wall having a pair of structural supports attached to each end of the two-dimensional calibration wall; and,
        a three-dimensional structural assembly extending from the two-dimensional calibration wall, the three-dimensional structural assembly comprising a first three-dimensional structural assembly positioned exterior to a second three-dimensional structural assembly;
    a plurality of non-movable reflective targets disposed on the structural frame assembly;
    at least three positioning stages coupled to the structural frame assembly respectively about each of the three mutually orthogonal axes;
    at least one movable reflective target disposed on each positioning stage;
    a laser projection calibration system comprising:
        a laser projector apparatus to be calibrated; and,
        a plurality of laser beams projected from the laser projector apparatus and projected at selected non-movable reflective targets and the at least one movable reflective target;
    wherein the non-movable reflective targets and the at least one movable reflective target are each configured to reflect a laser beam from the laser projector apparatus of the laser projection calibration system.

9. The system of claim 8, further comprising at least one non-movable non-reflective target disposed on the structural frame assembly.

10. The system of claim 8, further comprising one or more mounting elements coupled to the structural frame assembly.

11. The system of claim 8, wherein the three-dimensional structural assembly extends behind the two-dimensional calibration wall.

12. The system of claim 8, wherein the three-dimensional structural assembly extends in front of the two-dimensional calibration wall.

13. The system of claim 8, wherein each of the at least three positioning stages is one of a two-axis positioning stage or a three-axis positioning stage.

14. The system of claim 8, wherein the laser projector apparatus to be calibrated is a three-dimensional laser projector apparatus to be calibrated.

15. A method for calibrating a laser projection system, the method comprising:
    projecting a plurality of laser beams from a laser projection system to a corresponding number of at least three reflective targets positioned on a structural frame assembly extending along three mutually orthogonal axes of a reference system, the structural frame assembly comprising a two-dimensional calibration wall having a pair of structural supports attached to the two-dimensional calibration wall, and further comprising a three-dimensional structural assembly extending from the two-dimensional calibration wall, the three-dimensional structural assembly comprising a first three-dimensional structural assembly positioned exterior to a second three-dimensional structural assembly, wherein a proximity of each reflective target to the other reflective targets defines a laser projection calibration system having a predetermined tolerance;
    centering each of one or more first laser beams from the plurality of laser beams onto a corresponding non-movable reflective target included in the at least three reflective targets;
    moving one or more movable reflective targets included in the at least three reflective targets so that each of one or more second laser beams from the plurality of laser beams is centered on a movable reflective target;

obtaining one or more measurements that indicate a deviation of each of the one or more movable reflective targets from a corresponding original position; and, comparing at least one deviation to a corresponding predetermined tolerance in order to calibrate the laser projection system.

16. The method of claim 15, further comprising providing one or more non-movable non-reflective targets to verify a three-dimensional projection capability onto the one or more non-movable non-reflective targets.

17. The method of claim 15, further comprising determining that the laser projection system is usable if the deviation is within the corresponding predetermined tolerance, and determining that the laser projection system is unusable if at least one deviation is outside one or more corresponding predetermined tolerances.

18. The method of claim 15, wherein moving the one or more movable reflective target includes moving each movable reflective target laterally along a first axis and laterally along a second axis that is perpendicular to the first axis.

19. The method of claim 18, wherein moving the one or more movable reflective target further includes moving each movable reflective target laterally along a third axis that is perpendicular to the first axis and perpendicular to the second axis.

20. The method of claim 15, wherein the non-movable reflective targets establish a reference frame and provide alignment of the laser projection system, and the movable reflective targets determine a projection accuracy measurement of the laser projection system.

* * * * *